(12) United States Patent
Ishimaru et al.

(10) Patent No.: US 7,130,223 B2
(45) Date of Patent: Oct. 31, 2006

(54) NONVOLATILE SEMICONDUCTOR MEMORY DEVICE

(75) Inventors: Tetsuya Ishimaru, Kokubunji (JP); Nozomu Matsuzaki, Kokubunji (JP); Hitoshi Kume, Musashino (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/251,963

(22) Filed: Oct. 18, 2005

(65) Prior Publication Data
US 2006/0050557 A1  Mar. 9, 2006

Related U.S. Application Data

(63) Continuation of application No. 10/743,783, filed on Dec. 24, 2003, now Pat. No. 6,972,997.

(30) Foreign Application Priority Data

Dec. 26, 2002  (JP)  ............... P2002-375921
Dec. 18, 2003  (JP)  ............... P2003-420916

(51) Int. Cl.
*G11C 11/34* (2006.01)
(52) U.S. Cl. ............... 365/185.29; 365/185.28
(58) Field of Classification Search ........... 365/185.29, 365/185.28, 185.14, 185.18, 185.33
See application file for complete search history.

(56) References Cited

U.S. PATENT DOCUMENTS

| | | | |
|---|---|---|---|
| 5,561,620 A | 10/1996 | Chen et al. | 365/185.3 |
| 5,940,325 A | 8/1999 | Chang et al. | 365/185.28 |
| 5,943,261 A * | 8/1999 | Lee | 365/185.14 |
| 5,969,383 A | 10/1999 | Chang et al. | 257/316 |
| 5,991,204 A | 11/1999 | Chang | 365/185.29 |
| 6,051,860 A * | 4/2000 | Odanaka et al. | 257/316 |
| 6,426,898 B1 | 7/2002 | Mihnea et al. | 365/185.3 |
| 6,525,970 B1 | 2/2003 | Wang et al. | 365/185.29 |
| 2003/0198086 A1 | 10/2003 | Shikuri | 365/185.18 |

FOREIGN PATENT DOCUMENTS

JP  2001-102466  4/2001

OTHER PUBLICATIONS

Tanaka et al., "A 512kb MONOS type Flash Memory Module Embedded in a Microcontroller," 2003 Symposium on VLSI Circuits Digest of Technical Papers, pp. 211-212.

* cited by examiner

*Primary Examiner*—Anh Phung
(74) *Attorney, Agent, or Firm*—Miles & Stockbridge PC

(57) ABSTRACT

Characteristics of a nonvolatile semiconductor memory device are improved. The memory cell comprises: an ONO film constituted by a silicon nitride film SIN for accumulating charge and by oxide films BOTOX and TOPOX disposed thereon and thereunder; a memory gate electrode MG disposed at an upper portion thereof; a select gate electrode SG disposed at a side portion thereof through the ONO film; a gate oxide film SGOX disposed thereunder. By applying a potential to a select gate electrode SG of a memory cell having a source region MS and a drain region MD and to the source region MS and by accelerating electrons flowing in a channel through a high electric field produced between a channel end of the select transistor and an end of an n-type doped region ME disposed under the memory gate electrode MG, hot holes are generated by impact ionization, and the hot holes are injected into a silicon nitride film SIN by a negative potential applied to the memory gate electrode MG, and thereby an erase operation is performed.

8 Claims, 27 Drawing Sheets

FIG.2

|  | Vsg | Vmg | Vs | Vd | Vwell | |
|---|---|---|---|---|---|---|
| WRITE (HOT ELECTRON INJECTION) | 0.7 | 10 | 6 | 0 | 0 | SET CHANNEL CURRENT BY Vsg |
|  | 1.5 | 10 | 6 | 0.8 | 0 | SET CHANNEL CURRENT BY Vd |
| ERASE (HOT HOLE INJECTION) | 0.7 | -8 | 7 | 0 | 0 | SET CHANNEL CURRENT BY Vsg |
|  | 1.5 | -8 | 7 | 0.8 | 0 | SET CHANNEL CURRENT BY Vd |
| READ | 1.5 | 1.5 | 0 | 1.5 | 0 | REVERSE |
|  | 1.5 | 1.5 | 1.5 | 0 | 0 | FORWARD |

FIG.7

|  |  | SGL0 | SGL1~3 | MGL0 | MGL1~3 | SL0 | SL1 | BL0 | BL1 | SELECTED CELLS |
|---|---|---|---|---|---|---|---|---|---|---|
|  | WRITE | 0.7 | 0 | 10 | 0 | 6 | 0 | 0 | 1.5 | BIT1 |
| ERASE | BIT ERASE | 0.7 | 0 | -8 | 0 | 7 | 0 | 0 | 1.5 | BIT1 |
|  | WORD ERASE | 0.7 | 0 | -8 | 0 | 7 | 0 | 0 | 0 | WORD1 |
|  | BLOCK ERASE | 0.7 | 0.7 | -8 | -8 | 7 | 6 | 0 | 0 | ALL |
| READ | REVERSE | 1.5 | 0 | 1.5 | 0 | 0 | 0 | 1.5 | 0 | BIT1 |
|  | FORWARD | 1.5 | 0 | 1.5 | 0 | 1.5 | 0 | 0 | 1.5 | BIT1 |

FIG.8

|  |  | SGL0 | SGL1~3 | MGL0 | MGL1~3 | SL0 | SL1 | BL0 | BL1 | SELECTED CELLS |
|---|---|---|---|---|---|---|---|---|---|---|
|  | WRITE | 1.5 | 0 | 10 | 0 | 6 | 0 | 0.8 | 1.5 | BIT1 |
| ERASE | BIT ERASE | 1.5 | 0 | -8 | 0 | 7 | 0 | 0.8 | 1.5 | BIT1 |
|  | WORD ERASE | 1.5 | 0 | -8 | 0 | 7 | 0 | 0.8 | 0.8 | WORD1 |
|  | BLOCK ERASE | 1.5 | 1.5 | -8 | -8 | 7 | 6 | 0.8 | 0.8 | ALL |
| READ | REVERSE | 1.5 | 0 | 1.5 | 0 | 0 | 0 | 1.5 | 0 | BIT1 |
|  | FORWARD | 1.5 | 0 | 1.5 | 0 | 1.5 | 0 | 0 | 1.5 | BIT1 |

FIG.11

|  | | SGL0 | SGL1~3 | MGL | SL | BL0 | BL1 | SELECTED CELLS |
|---|---|---|---|---|---|---|---|---|
| | WRITE | 0.7 | 0 | 10 | 6 | 0 | 1.5 | BIT1 |
| ERASE | BIT ERASE | 0.7 | 0 | −8 | 7 | 0 | 1.5 | BIT1 |
| | WORD ERASE | 0.7 | 0 | −8 | 7 | 0 | 0 | WORD1 |
| | BLOCK ERASE | 0.7 | 0.7 | −8 | 7 | 0 | 0 | ALL |
| READ | REVERSE | 1.5 | 0 | 1.5 | 0 | 1.5 | 0 | BIT1 |
| | FORWARD | 1.5 | 0 | 1.5 | 1.5 | 0 | 1.5 | BIT1 |

FIG.12

|  | | SGL0 | SGL1~3 | MGL | SL | BL0 | BL1 | SELECTED CELLS |
|---|---|---|---|---|---|---|---|---|
| | WRITE | 1.5 | 0 | 10 | 6 | 0.8 | 1.5 | BIT1 |
| ERASE | BIT ERASE | 1.5 | 0 | −8 | 7 | 0.8 | 1.5 | BIT1 |
| | WORD ERASE | 1.5 | 0 | −8 | 7 | 0.8 | 0.8 | WORD1 |
| | BLOCK ERASE | 1.5 | 1.5 | −8 | 7 | 0.8 | 0.8 | ALL |
| READ | REVERSE | 1.5 | 0 | 1.5 | 0 | 1.5 | 0 | BIT1 |
| | FORWARD | 1.5 | 0 | 1.5 | 1.5 | 0 | 1.5 | BIT1 |

FIG.13
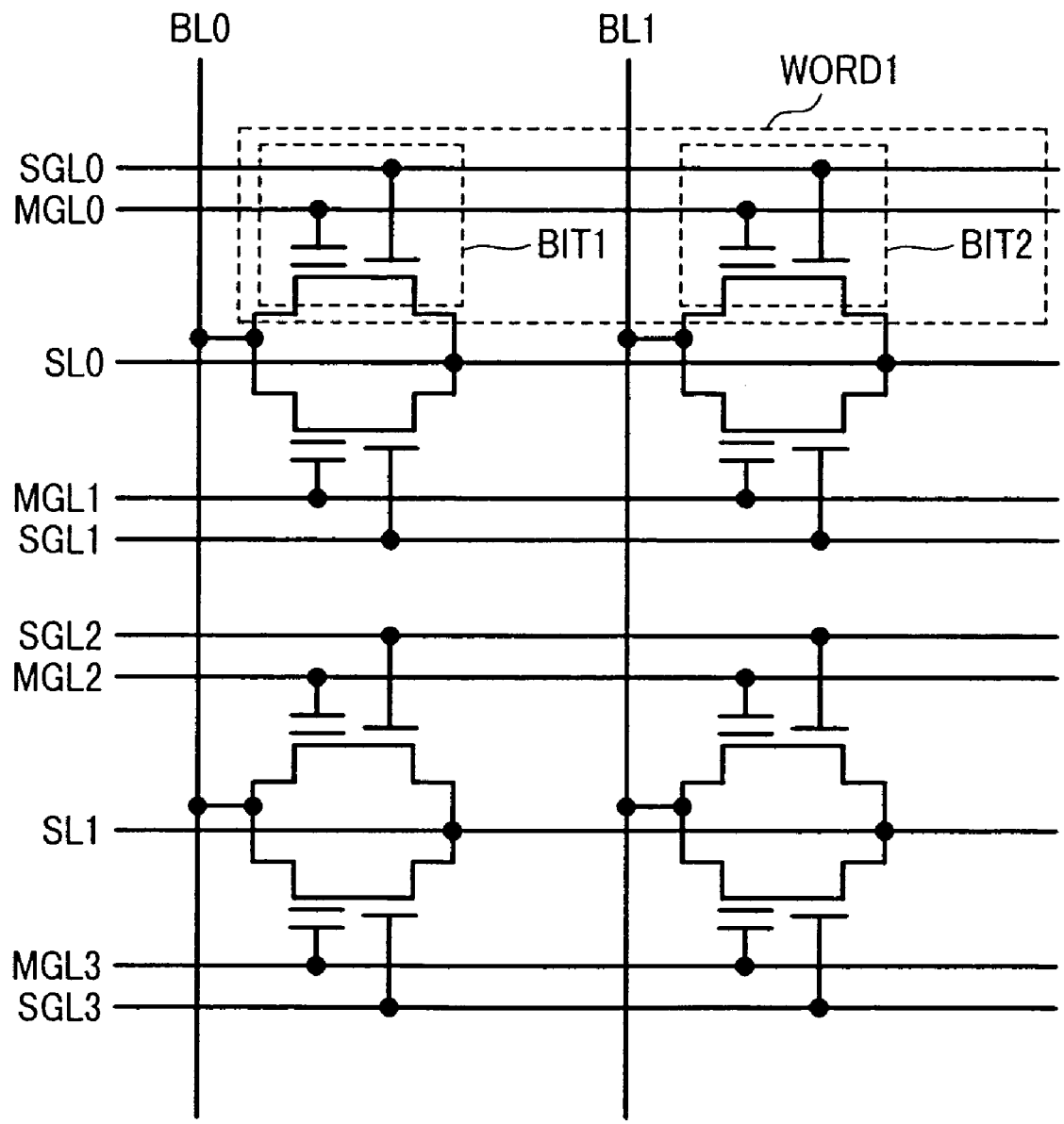
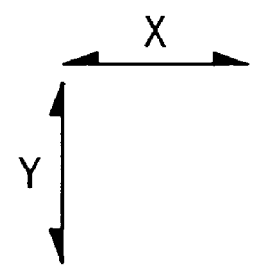

FIG.14

|  |  | SGL0 | SGL1~3 | MGL0 | MGL1~3 | SL0 | SL1 | BL0 | BL1 | SELECTED CELLS |
|---|---|---|---|---|---|---|---|---|---|---|
|  | WRITE | 0.7 | 0 | 10 | 0 | 0 | 1.5 | 6 | 0.8 | BIT1 |
| ERASE | BIT ERASE | 0.7 | 0 | -8 | 0 | 0 | 1.5 | 7 | 0.8 | BIT1 |
| ERASE | WORD ERASE | 0.7 | 0 | -8 | 0 | 0 | 1.5 | 7 | 7 | WORD1 |
| ERASE | BLOCK ERASE | 0.7 | 0.7 | -8 | -8 | 0 | 0 | 7 | 7 | ALL |
| READ | REVERSE | 1.5 | 0 | 1.5 | 0 | 1.5 | 0 | 0 | 1.5 | BIT1 |
| READ | FORWARD | 1.5 | 0 | 1.5 | 0 | 0 | 0 | 1.5 | 0 | BIT1 |

FIG.15

|  |  | SGL0 | SGL1~3 | MGL0 | MGL1~3 | SL0 | SL1 | BL0 | BL1 | SELECTED CELLS |
|---|---|---|---|---|---|---|---|---|---|---|
|  | WRITE | 1.5 | 0 | 10 | 0 | 0.8 | 1.5 | 6 | 0.8 | BIT1 |
| ERASE | BIT ERASE | 1.5 | 0 | -8 | 0 | 0.8 | 1.5 | 7 | 0.8 | BIT1 |
| ERASE | WORD ERASE | 1.5 | 0 | -8 | 0 | 0.8 | 1.5 | 7 | 7 | WORD1 |
| ERASE | BLOCK ERASE | 1.5 | 1.5 | -8 | -8 | 0.8 | 0.8 | 7 | 7 | ALL |
| READ | REVERSE | 1.5 | 0 | 1.5 | 0 | 1.5 | 0 | 0 | 1.5 | BIT1 |
| READ | FORWARD | 1.5 | 0 | 1.5 | 0 | 0 | 0 | 1.5 | 0 | BIT1 |

NONVOLATILE SEMICONDUCTOR MEMORY DEVICE

CROSS-REFERENCE TO RELATED APPLICATION

This application is a continuation of application Ser. No. 10/743,783 filed Dec. 24, 2003 now U.S. Pat No. 6,972,997, issued on Dec. 6, 2005.

BACKGROUND OF THE INVENTION

The invention relates to a nonvolatile semiconductor memory device and, more particularly, to a nonvolatile semiconductor memory device, which is suitable to speed up an erase operation and a read operation and improve data retention characteristics, write/erase endurance characteristics, or write disturb characteristics.

As electrically erasable and programmable nonvolatile semiconductor memory devices, EEPROMs (Electrically Erasable and Programmable Read Only Memories) are popularly used. Each of these memory devices (memories) represented by flash memories has a conductive floating gate electrode or a trapping insulator film which are surrounded by an oxide film under a gate electrode of a MOS (Metal Oxide Semiconductor) transistor. This trapping insulator film means an insulator film, which can accumulate charges therein, and may be, by way of example, a silicon nitride film or the like.

Injection and discharge of charges into/from these charge accumulation regions cause the threshold voltage of a MOS transistor to be shifted and to operate as a memory device.

There is used, as the flash memory, a split-gate cell employing a MONOS (Metal-Oxide-Nitride-Oxide-Semiconductor) structure that will be described later.

In the memory, since a silicon nitride film is used as a charge accumulation region, the following advantages are achieved: in comparison with a conductive floating gate film, 1) reliability of data retention is high due to discrete accumulation of charges; 2) because of high reliability of the data retention, oxide films located on upper and/or lower side of the silicon nitride film can be thinned and write/erase operations can be performed at low voltages; and the like.

By using the split-gate cell, the following advantages are also achieved: 1) hot electrons can be injected into the silicon nitride film by a source-side injection method and good electron injection efficiency can be achieved, whereby the write operation can be performed at a high speed and with a low current; 2) since the write/erase operations are easily controlled, a peripheral circuit can be made small in scale; and the like.

As erase methods for the above-mentioned memory, there are given two methods, i.e., a tunneling erase method and a BTBT (Band-To-Band Tunneling) hot hole injection erase method.

For example, Patent Document 1 (Japanese Patent Laid-open No. 2001-102466) discloses a memory cell using a tunneling erase method. Further, Patent Document 2 (U.S. Pat. No. 5,969,383) discloses a memory cell using the BTBT hot hole injection erase method.

In the tunneling erase method, electrons, injected into a silicon nitride film by a source-side injection write method, are tunneled through an oxide film located on upper or lower side of the silicon nitride film by applying a positive or negative voltage to a gate electrode, and are extracted into the gate electrode or a substrate to perform an erase operation.

In the other BTBT hot hole injection erase method, a high voltage is applied between a source and a gate electrode, and holes with positive charges generated by the BTBT are accelerated by an electric field directed to a channel direction at an end of a source diffusion layer and are attracted by the negative voltage of the gate electrode and are injected into the silicon nitride film to perform an erase operation (see FIG. 32).

[Patent Document 1]
Japanese Patent Laid-open No. 2001-102466
[Patent Document 2]
U.S. Pat. No. 5,969,383

SUMMARY OF THE INVENTION

However, in a case of the tunneling erase method, the trade-off relation between data retention characteristics and erase characteristics arises as a problem.

More specifically, to improve the data retention characteristics, either of the oxide film located on the upper or lower side of the silicon nitride film and the silicon nitride film itself must be increased in thickness. However, as a result of the increase in thickness, an erase speed becomes low.

To increase the erase speed, a high erase voltage is required. However, the high erase voltage causes a peripheral circuit to be a large-scale circuit and thereby a chip cost is increased.

Furthermore, the thickness of the oxide film from which electrons are tunneled is limited so that the tunneling of electrons occurs, whereby the improvement of the data retention characteristics are restricted.

Another problem is that a threshold voltage after the erase operation cannot be sufficiently lowered.

More specifically, because erase operation is carried out not by injecting holes into the silicon nitride but by extracting electrons from the silicon nitride film, a threshold voltage after the erase operation cannot be made lower than the initial threshold voltage at which the silicon nitride film is electrically neutral, and a reading current cannot be made large. This is the disadvantage to increase in speed of the read operation.

In the other case of the BTBT hot hole injection erase method, the above-mentioned problem of the tunneling erase method can be solved.

More specifically, the methods, in which hot electrons are injected during the write operation and hot holes are injected during the erase operation, can make the oxide films located on the upper and lower sides of the silicon nitride film thicker than those obtained in the case of tunneling erase method.

Additionally, the threshold voltage obtained after the erase operation can be shifted to a negative side from the initial value by the hole injection erasing.

However, a problem of this system arises so that since the position where hot electrons are generated during a write operation is different from that where hot holes are generated during an erase operation, it is difficult to control the positioning of electron injection during the write operation and hole injection during the erase operation.

More specifically, the position where the hot electrons are generated during the write operation corresponds to, as shown in FIG. 31, a gap portion ("a" portion) between a memory gate electrode MG and a select gate electrode SG while the position where the hot holes are generated during the erase operation corresponds to, as shown in FIG. 32, an end ("b" portion) of a source region MS. Note that FIG. 31 is a schematic view showing an electron injection state into a charge accumulation portion of a flash memory. FIG. 32 is a schematic view showing a hole injection state into the charge accumulation portion of the flash memory. Respective parts of the flash memory are denoted by the same reference numerals as those in embodiments of the present invention described later, and so the description thereof will be omitted.

In a memory cell in which charges are discretely accumulated in a silicon nitride film, the charges cannot freely move in the silicon nitride film. Therefore, when any deviation from the charge injection position occurs, the following deterioration of the memory characteristics is caused: (1) since electrons cannot be erased until a larger number of holes are injected, the erase speed becomes low; (2) when the write and erase operations are repeated, some of the electrons injected during the write operation are left without being erased and the erase speed is considerably reduced; (3) since unnecessary holes have been injected in the silicon nitride film, a bottom oxide film is deteriorated and consequently deterioration of the write/erase endurance characteristics and the data retention characteristics is caused; and (4) since the electrons and the holes coexist at adjacent positions in a silicon nitride film SIN, the data retention characteristics are deteriorated (when the write and erase operations are performed even once, data retention characteristics are considerably deteriorated).

Still another problem arises so that since holes are accelerated at the end of the source region to perform an erase operation, a source profile is restricted to a field-concentration type one.

In order to use the source profile as the field-concentration type one, a channel region of a memory transistor must be of a p-type having high concentration. Therefore, this is disadvantageous from the viewpoint of carrying a large read current, i.e., of making the read speed high.

An object of the present invention is to achieve high performance and reliability of a nonvolatile semiconductor memory device.

Particularly, an object thereof is to achieve improvement of a read speed and speed-up of an erase operation in a nonvolatile semiconductor memory device.

Another object thereof is to improve write/erase endurance characteristics and data retention characteristics of a nonvolatile semiconductor memory device.

The above and other objects and novel features will become apparent from the description of the specification and the accompanying drawings.

Outlines of representative ones among the inventions disclosed in the present application will be briefly described as follows.

A nonvolatile semiconductor memory device according to the present invention comprises: (a) first and second semiconductor regions formed in a semiconductor substrate; (b) first and second conductors formed at an upper portion of said semiconductor substrate and on a portion between said first and second semiconductor regions; (c) a first insulator film formed between said first conductor and said semiconductor substrate; and (d) a second insulator film formed between said second conductor and said semiconductor substrate, the second insulator film having a charge accumulation portion therein, wherein (e) while a positive potential is applied to said first conductor and a current flows between said first and second semiconductor regions, holes are injected into said charge accumulation portion, in which electrons are accumulated, and thereby an erase operation is performed.

Further, a nonvolatile semiconductor memory device according to the present invention comprises: a plurality of memory cells disposed in an array manner, each of the memory cells including: (a) first and second semiconductor regions formed in a semiconductor substrate; (b) first and second conductors formed at an upper portion of said semiconductor substrate and on a portion between said first and second semiconductor regions; (c) a first insulator film formed between said first conductor and said semiconductor substrate; and (d) a second insulator film formed between said second conductor and said semiconductor substrate, the second insulator film having a charge accumulation portion therein, wherein (e) the memory device including: a plurality of first lines for connecting said first conductors of the memory cells arranged in a first direction in said plurality of memory cells; and a plurality of second lines for connecting said first semiconductor regions disposed on a side of said first conductor in the memory cells arranged in a second direction perpendicular to said first direction, and (f) while a positive potential is applied to said first line connected with a selected memory cell of said plurality of memory cells and a current flows between said first and second semiconductor regions, holes are injected into said charge accumulation portion of said selected memory cell, in which electrons are accumulated, and thereby an erase operation is performed.

BRIEF DESCRIPTION OF THE DRAWINGS

FIG. 2 is a table showing application conditions of voltages applied to respective parts of a selected memory cell in write, erase, and read operations of the nonvolatile semiconductor memory device according to the embodiment of the present invention.

FIG. 7 is a table showing conditions of voltages applied to respective wiring layers in write, erase, and read operations in the memory array in FIG. 6.

FIG. 8 is a table showing conditions of voltages applied to respective wiring layers in write, erase, and read operations in the memory array in FIG. 6.

FIG. 11 is a table showing conditions of voltages applied to respective wiring layers in write, erase, and read operations in the memory array in FIG. 10.

FIG. 12 is a table showing conditions of voltages applied to respective wirings in write, erase, and read operations in the memory array in FIG. 10.

FIG. 13 is a circuit diagram showing another nonvolatile semiconductor memory array according to an embodiment of the present invention.

FIG. 14 is a table showing conditions of voltages applied to respective wiring layers in write, erase, and read operations in the memory array in FIG. 13.

FIG. 15 is a table showing conditions of voltages applied to respective wiring layers in write, erase, and read operations in the memory array in FIG. 13.

DESCRIPTION OF THE PREFERRED EMBODIMENTS

Embodiments of the present invention will be below described in detail based on the accompanying drawings. Note that parts having the same functions are denoted by the same referential symbols, through all of the drawings used for describing the embodiments, and the description of the reciprocation thereof will be omitted.

(1) The basic configuration of a nonvolatile semiconductor memory device (flash memory) according to the present invention will be described below.

Figure 1:
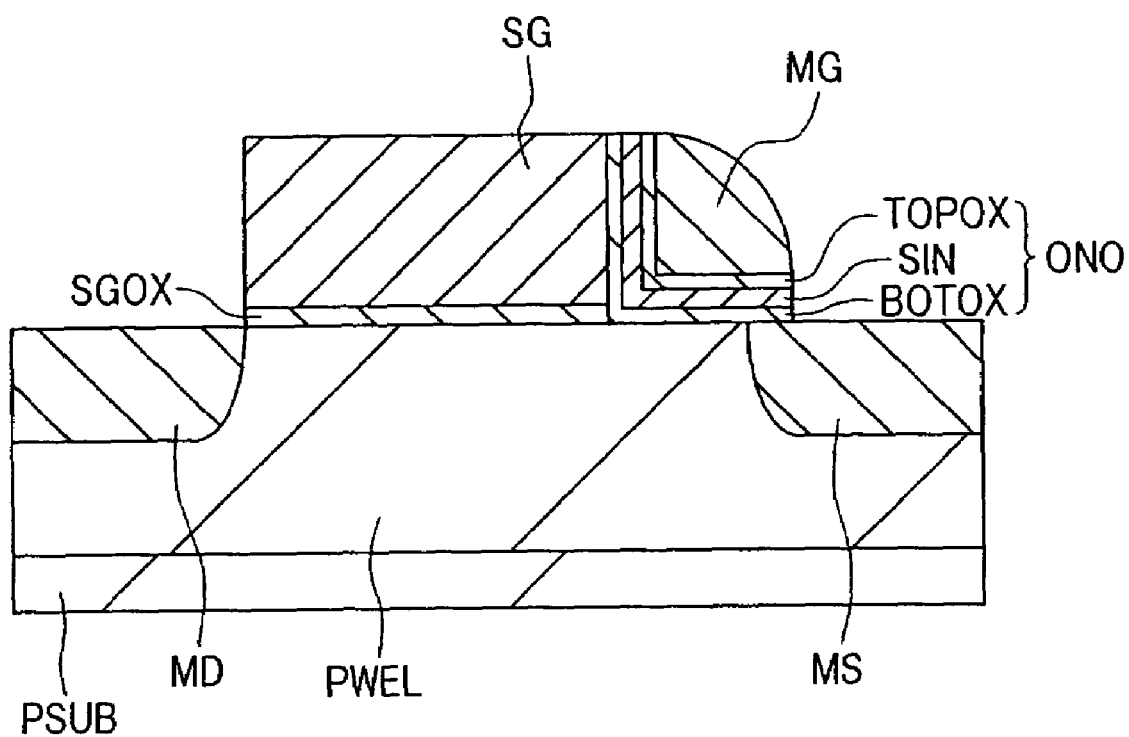
FIG. 1 is a sectional view showing a principal portion of a nonvolatile semiconductor memory device (flash memory according to an embodiment of the present invention.

FIG. 1 is a sectional view showing a principal portion of a nonvolatile semiconductor memory device according to this embodiment.

This flash memory is a split-gate type cell using an MONOS structure.

As shown in FIG. 1, the memory cell includes: an ONO film ONO, which is composed of a laminating film of a silicon nitride film SIN for accumulating charges and oxide films BOTOX and TOPOX located respectively on the upper and lower sides thereof; a memory gate electrode MG made of a conductor such as n-type polysilicon; an select gate electrode SG made of n-type polysilicon; a gate oxide film SGOX located under the select gate electrode SG; a source region (source diffusion layer, an n-type semiconductor region) MS containing an n-type impurity; and a drain region (drain diffusion layer, an n-type semiconductor region) MD containing an n-type impurity. Note that the source region MS and the drain region MD are formed in a p-type well region PWEL formed on a p-type silicon substrate (semiconductor substrate) PSUB.

Hereinafter, a MOS transistor constituted by the memory gate electrode MG is referred to as "a memory transistor", and a MOS transistor constituted by the select gate electrode SG is referred to as "a select transistor".

Next, write, erase, and read operations will be described below. In this description, injection of electrons into the silicon nitride film SIN is defined as "write", and injection of holes is defined as "erase".

(1-1) A write method is a hot electron write method generally called a source-side injection method.

FIG. 2 is a table showing application conditions of voltages applied to respective parts of a selected memory cell in "write", "erase", and "read" operations in this embodiment.

As shown in the upper stage of a "write" column in FIG. 2, during the write operation, a voltage Vs applied to the source region MS is 6 V; a voltage Vmg applied to the memory gate electrode MG is 10 V; a voltage Vd applied to the drain region MD is 0 V; and a voltage Vsg applied to the select gate electrode SG is controlled so that a channel current in the write operation is a predetermined value. The voltage Vsg at this time is determined by a predetermined current value and a threshold voltage value of the select transistor. For example, when the predetermined current value is 1 μA, the voltage Vsg is approximately 0.7 V. A voltage of 0 V (Vwell) is applied to the well.

In the above-mentioned voltage conditions, although the channel current in the write operation is set by the voltage Vsg applied to the select gate electrode SG, the voltage Vsg may be set at 1.5 V and the channel current may be set by the voltage Vd. At this time, the voltage Vd is also determined by the predetermined value of the channel current and the threshold voltage of the select transistor, and is, for example, approximately 0.8 V when the predetermined current value is 1 μA (see the lower stage of "write" column in FIG. 2).

Under the above two conditions, a constant voltage is applied to perform the write operation, and a current flowing in a channel during the write operation is determined by a potential difference between the select gate electrode SG and the drain region MD and by the threshold voltage of the select transistor. If any deviation from the threshold voltage of the select transistor occurs, a deviation of the channel current is generated and a write speed varies due thereto. To suppress the variation of the write speed, the voltage Vd may be automatically controlled so that the predetermined channel current is obtained by using a circuit. By using a circuit system described in the known document, i.e., pp. 211 to 212 of Proceedings of IEEE VLSI Circuits Symposium on 2003, it is possible to perform only a write operation of a constant channel current.

The channel current in the write operation is set at approximately 0.1 to 10 μA. The write speed increases in proportion to the channel current. However, as the channel current is increased, the area of power supply also increases or the number of bits that are simultaneously written decreases.

Figure 31:
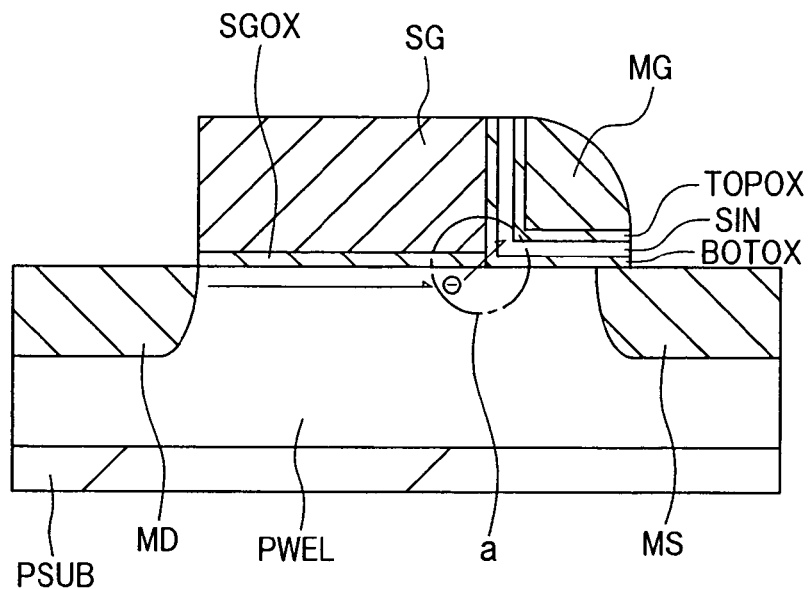
FIG. 31 is a sectional showing of a principal portion of a substrate indicating positions where hot electrons are generated in a write operation of the nonvolatile semiconductor memory device for explaining the problem of the present invention.
Figure 32:
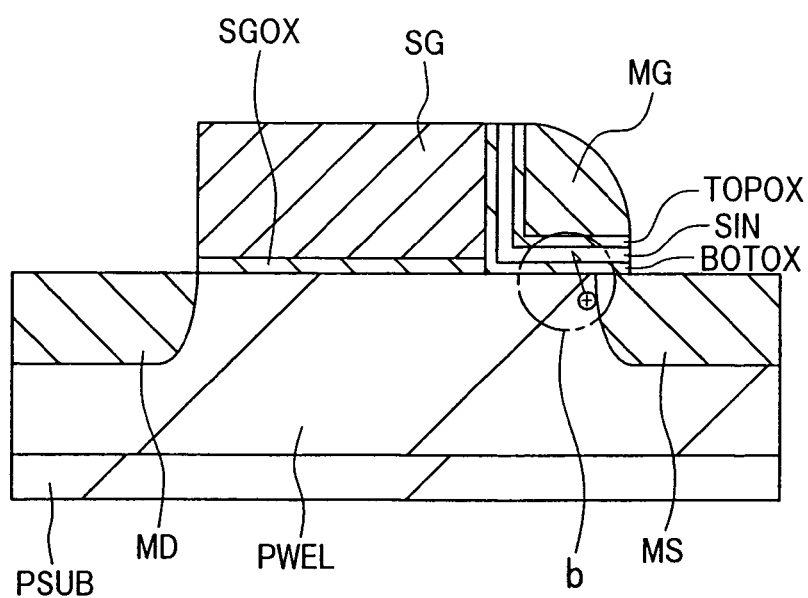
FIG. 32 is a sectional showing of a principal portion of a substrate indicating positions where hot holes are generated in an erase operation of the nonvolatile semiconductor memory device for explaining the problem of the present invention.

A generation region of hot electrons is a channel region (between the source and the drain) located under and between the two gate electrodes (MG and SG). The hot electrons are locally injected into only the silicon nitride film SIN on the select transistor side below the memory gate electrode MG (see the "a" portion in FIG. 31). More specifically, the hot electrons are locally injected near an end of the silicon nitride film SIN, on a side of the select gate electrode SG under the memory gate electrode MG. The injected electrons are captured by a trap in the silicon nitride film SIN. As a result, the threshold voltage of the memory transistor becomes higher. An electron distribution has a peak near the end of the silicon nitride film SIN on the side of the select gate electrode SG.

(1-2) Then, an erase method will be described. The erase method according to the present invention is a hot hole injection erase method using a channel current.

As shown in the upper stage of an "erase" column in FIG. 2, in an erase operation, a voltage Vmg applied to the memory gate electrode MG is set at −8 V, the sign of which is opposite to that of the voltage applied in a write operation; a voltage Vs applied to the source region MS is set at 7 V; a voltage Vd applied to the drain region MD is set at 0 V; and a voltage Vsg applied to the select gate electrode SG is controlled so that the channel current in the erase operation has a certain predetermined value. At this time, the voltage Vsg is determined by the predetermined current value and the threshold voltage value of the select transistor, and is, for example, approximately 0.7 V when the predetermined current value is 1 μA. A voltage of 0 V (Vwell) is applied to the well.

Note that if the write conditions are set as described on the lower stage of the "write" column in FIG. 2, the erase conditions can be set as described on the lower stage of the "erase" column in FIG. 2.

Similarly to the write operation, the voltage Vd may be automatically controlled so that a predetermined channel current is obtained by using a circuit. In this automatic control, there is preferably employed the same circuit as that used in performing the write operation of the above-mentioned predetermined channel current. By making constant the current flowing in the channel regardless of the variation of threshold voltage of the select transistor, the variation of the erase speed can be suppressed.

Figure 33:
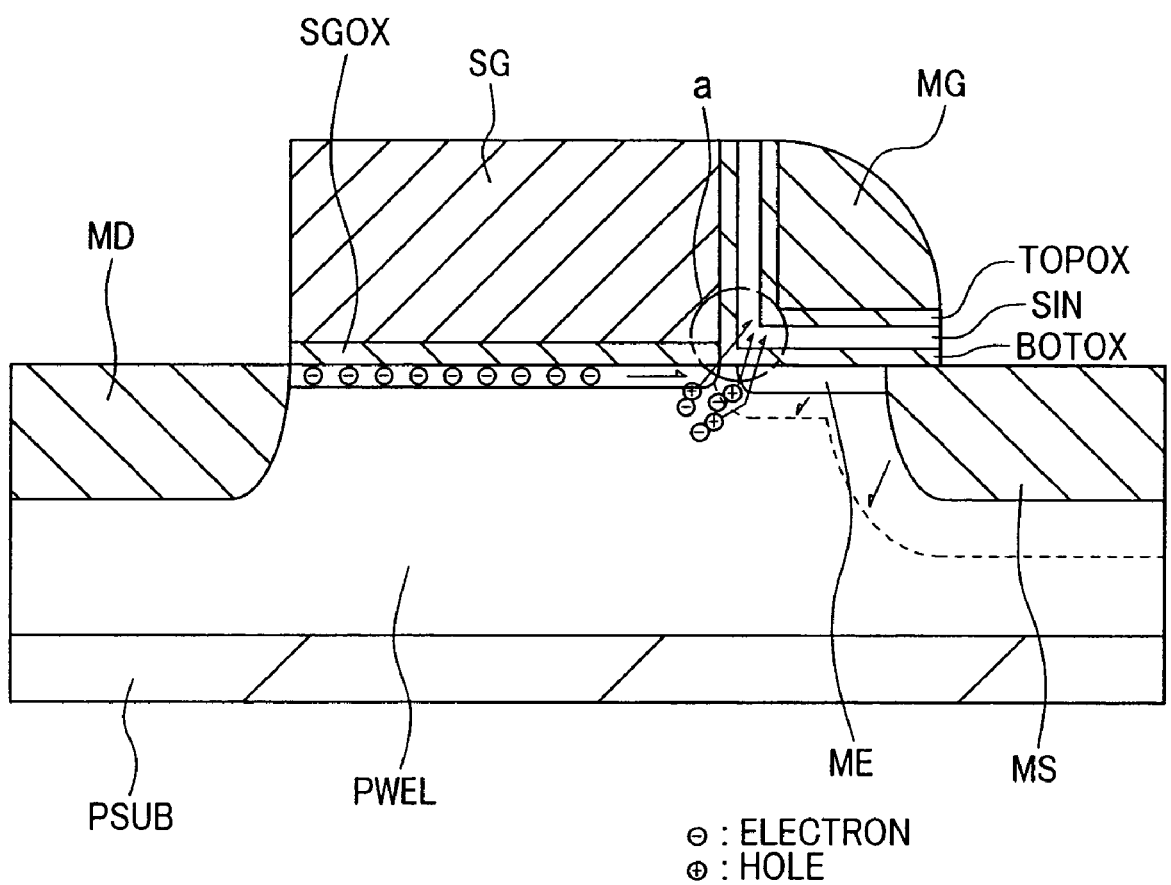
FIG. 33 is a sectional view showing a principal portion of a memory cell schematically indicating a state of charges when an erase potential is applied to a nonvolatile semiconductor memory device for explaining effects of the present invention.

Consider the case that, for example, a channel of the memory transistor is made to be an n-type one, i.e., an n-type doped region (n-type diffusion layer and/or n-type semiconductor region) ME is formed in the silicon substrate below the memory gate electrode MG (see ME in FIG. 16), and that the above-mentioned voltages are applied. This n-type diffusion layer has concentration lower than those of the source region and the drain region. FIG. 33 is a sectional view showing a principle portion of a memory cell schematically illustrating a state of charges when the potential described in the "erase" column in FIG. 2 is applied.

In this case, the select transistor is turned on. More specifically, a channel is formed in the silicon substrate under the select gate electrode SG. Furthermore, since a high voltage is applied to the source region MS, a depletion layer extending from the source region MS and the above-mentioned n-type doped region ME below the memory gate electrode MG approaches the channel of the select transistor. As a result, even though a negative voltage is applied to the memory gate electrode MG, a current flows between the source and the drain (between MD and MS).

At this time, electrons flowing in the channel are accelerated by a high electric field created between a channel end of the select transistor and an end of the n-type doped region ME below the memory gate electrode MG, and impact ionization is caused, and pairs of electrons and holes are generated.

The holes are accelerated by an electric field (i.e., negative potential applied to the memory gate electrode MG) directed to a direction perpendicular to a channel plane to produce hot holes, and are injected into the silicon nitride film SIN. The injected holes are captured by a trap in the silicon nitride film SIN, whereby the threshold voltage of the memory transistor is lowered.

In this time, a generation region of hot holes is almost equal to that of hot electrons in the write operation. More specifically, the hot holes are locally injected in the vicinity ("a" portion) of an end of the side of the select gate electrode SG, in the silicon nitride film SIN below the memory gate electrode MG.

Therefore, the hot holes can be injected into the position where the hot electrons are injected in the write operation.

Note that the channel region below the memory gate electrode MG does not always require being of an n type. Even if the channel region is of a p type, a channel current flows when the channel length of the memory transistor is shortened, thereby allowing the erase operation to be performed. More specifically, it is preferably required that the depletion layer extending from the source region MS reaches the silicon substrate located under and near the boundary between the two gate electrodes (MG and SG).

Figure 3:
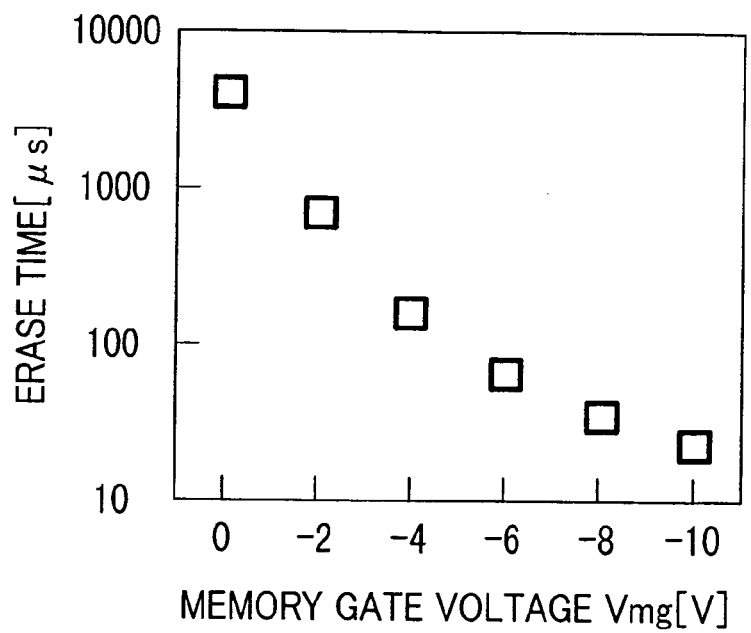
FIG. 3 is a graph showing the relation between erase time and a voltage applied to a memory gate in an erase operation in the nonvolatile semiconductor memory device (flash memory) according to the embodiment of the present invention.
Figure 4:
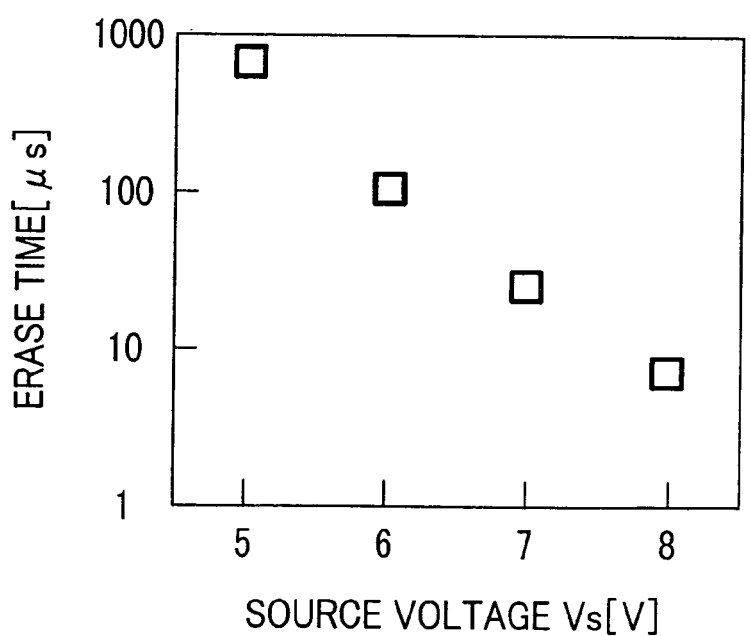
FIG. 4 is a graph showing the relation between erase time and a voltage applied to a source electrode in an erase operation in the nonvolatile semiconductor memory device (flash memory) according to the embodiment of the present invention.
Figure 5:
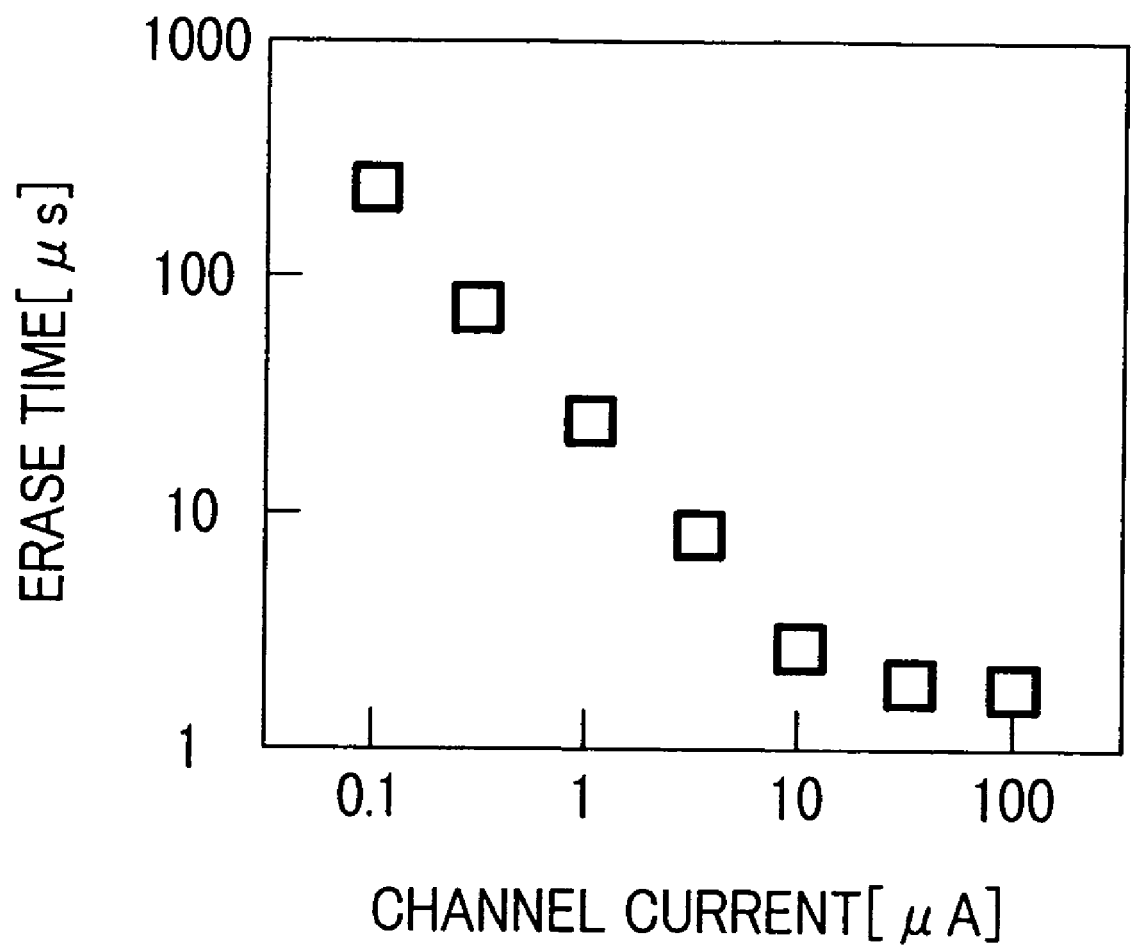
FIG. 5 is a graph showing the relation between erase time and a current flowing to a channel in an erase operation in the nonvolatile semiconductor memory device (flash memory) according to the embodiment of the present invention.

FIGS. 3 to 5 show dependencies of erase time on a memory gate voltage Vmg, a source voltage Vs, and a channel current.

First, as the memory gate voltage Vmg increases in a direction of negative voltage, the erase speed becomes high. However, if the memory gate voltage Vmg is excessively increased in the negative voltage direction, a voltage applied to the gate insulator film of the memory transistor, i.e., a potential difference between the voltages Vmg and Vs exceeds a withstand voltage of the gate insulator film. Even though the potential difference does not exceed the withstand voltage, when the memory gate voltage Vmg is excessively increased in the negative voltage direction, the bottom oxide film deteriorates considerably. The optimum value of the voltage Vmg is approximately −4 to −10 V depending on the thickness of the gate insulator film of the memory gate. However, even though the voltage Vmg is 0 V, the erase operation can be performed because the potential of the memory gate is lower than that of the source region. By setting, at 0 V, the voltage Vmg in the erase operation, the erase speed becomes low, but a power supply circuit configuration without negative-voltage power supply can be achieved, whereby an area of the power supply circuit can be reduced.

Subsequently, as the source voltage Vs is increased, the erase speed becomes high. However, when the voltage Vs is made excessively high, it exceeds the withstand voltage of the source diffusion layer. The optimum value of the voltage Vs is approximately 5 to 8 V.

As for the channel current, the erase speed is in approximate proportion to the value of the channel current. However, when the channel current value is excessively increased, the voltage Vsg applied to the select gate becomes large and an electric field, which is created between a channel end of the select transistor and an end of the n-type doped region ME below the memory gate electrode MG, becomes weak, whereby the erase speed does not increase. Additionally, due to the increase of the channel current, the area of the power supply circuit is enlarged. Therefore, the optimum value of the channel current is approximately 0.1 to 10 μA.

When the channel current value and the voltage Vs are equal to those in the write operation and when the optimum voltage is applied to the memory gate, the erase speed is lower than the write speed. This is because higher energy barrier of a hole than that of an electron in the bottom oxide film makes the injection efficiency of hot holes into the silicon nitride film SIN in the erase operation lower than that of hot electrons into the silicon nitride film SIN in the write operation.

To make the erase speed almost equal to the write speed, the voltage Vs in the erase operation must be higher than that in the write operation, or the channel current in the erase operation must be larger than that in the write operation. When the voltage Vs in the erase operation is set to be higher than in write operation without changing the channel current, an increase in the area of the power supply circuit may be small in comparison with the case where the channel current in the erase operation is set to be larger than that in the write operation without changing the source voltage Vs. However, to increase the voltage Vs, the breakdown voltage of the source diffusion layer must be increased. To the contrary, when the channel current in the erase operation is increased without increasing the voltage Vs, the breakdown voltage of the source diffusion layer need not be increased although the area of the power supply circuit increases. No need to increase the breakdown voltage of the source diffusion layer can make the effective channel length of the memory transistor smaller. As a result, the read current can be increased, whereby excellent scalability can be achieved.

As a matter of course, by increasing both the voltage Vs and the channel current, the erase speed can be further increased. When both the channel current value and the voltage Vs are made equal to those in the write operation, the area of the power supply circuit can be reduced although the erase speed decreases. If the number of memory cells simultaneously performing the erase operation is larger than that of memory cells simultaneously performing the write operation, a channel current per cell in the erase operation may often be smaller than that in the write operation. Since a total of channel current of target memory cells in the write operation is made equal to that in the erase operation, the current supply capacity of the power supply circuit can be effectively used.

(1-3) Next, a read method will be described. There are two read operations, i.e., a read operation in which a voltage between the source and the drain is applied in a reverse direction to the direction in the write operation and a read operation in which it is applied in a forward direction thereto.

In the case of the reverse-direction read operation, as shown in the upper stage of a "read" column in FIG. 2, a voltage Vd applied to the drain region MD is set at 1.5 V; a voltage Vs applied to the source region MS is set at 0 V; a voltage Vsg applied to the select gate electrode SG is set at 1.5 V; and a voltage Vmg applied to the memory gate electrode MG is set at 1.5 V.

In the case of the forward-direction read operation, as shown in the lower stage of the "read" column in FIG. 2, the voltage Vd applied to the drain region MD and the source voltage Vs applied to the source region MS are replaced with each other, and are set at 0 V and 1.5 V, respectively.

The voltage Vmg applied to the memory gate electrode MG in the read operation is set at a value ranging from the threshold voltage of the memory transistor in a write state to that of the memory transistor in an erase state. When the threshold voltages in the write and erase states are set respectively at 5 V and −2 V, the voltage Vmg in the read operation in FIG. 2 is an intermediate value between these threshold voltages. When the voltage Vmg is set at the intermediate value, the write state and the erase state can be discriminated even though the threshold voltage in the write state decreases by 2 to 3 V turning the data retention and even though the threshold voltage in the erase state increases by 2 to 3 V. Therefore, a margin of data retention characteristics is widened. If the threshold voltage of the memory cell in the erase state is made sufficiently low, the voltage Vmg in the read operation may be set at 0 V. When the voltage Vmg in the read operation is set at 0 V, read disturbance, i.e., a shift in threshold voltage caused by a voltage applied to the memory gate can be avoided.

(2) Subsequently, a memory operation performed when an array is constituted by a plurality of memory cells will be described.

Figure 6:
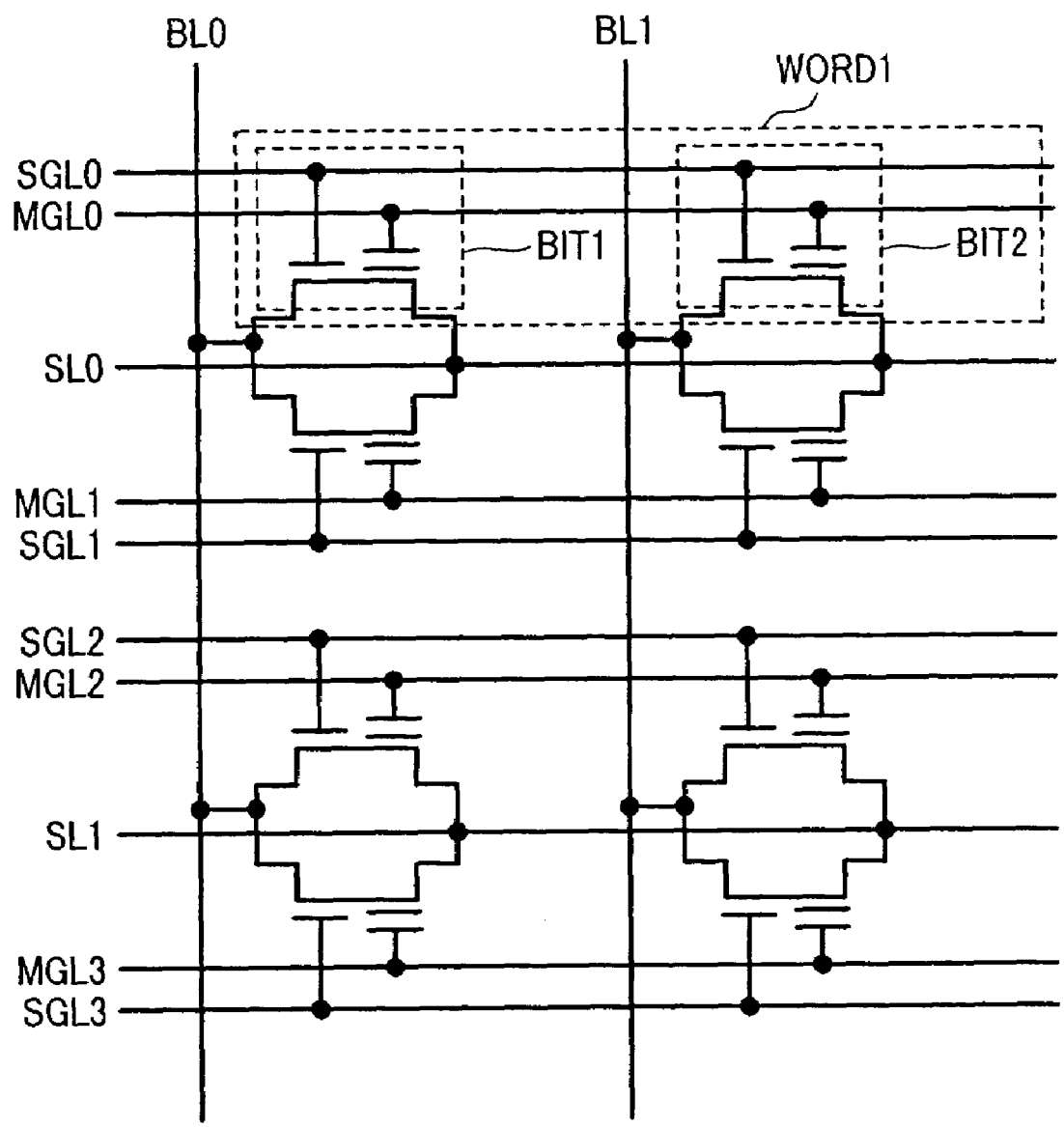
FIG. 6 is a circuit diagram showing a nonvolatile semiconductor memory array according to an embodiment of the present invention.

FIG. 6 is a circuit diagram showing a nonvolatile semiconductor memory array according to this embodiment. For sake of simplification, a total of 2×4 memory cells is only shown.

As shown in FIG. 6, the following lines extend parallel to a direction X: select gate lines (word lines) SGL0 to SGL3 with which the select gate electrodes SG of the respective memory cells are connected; memory gate lines MGL0 to MGL3 with which the memory gate electrodes MG are connected; and source lines SL0 and SL1 with which source regions MS shared by two adjacent memory cells are connected.

Further, bit lines BL0 and BL1 to which the drain regions MD of the memory cells are connected extend in a direction Y, i.e., a direction perpendicular to the select gate line SGL or the like.

Note that these wiring layers extend not only on the circuit diagram but also the layout of respective elements and wiring layers in the above-mentioned directions (FIG. 13 is also the same). Further, the select gate line SGL or the like may be constituted by the select gate electrodes SG or by the wiring layers arranged on the select gate electrodes SG.

Although not shown in FIG. 6, a boosting driver, which is constituted by a MOS transistor having a high breakdown voltage, is connected with the source line SL and the memory gate line MGL to apply a high voltage in the write and erase operation. Further, since only a low voltage of approximately 1.5 V is applied to the select gate line SGL, a boosting driver having a high speed and a lower breakdown voltage is connected with the select gate line SGL. With one local bit line, 16, 32, or 64 memory cells are connected. The local bit line is connected with a global bit line, through a MOS transistor for selecting a local bit line, and the global bit line is connected with a sense amplifier.

FIGS. 7 and 8 show the voltages applied to respective wiring layers in write, erase, and read operations in the memory array in FIG. 6. The difference between FIGS. 7 and 8 is the write and erase conditions. On the conditions of FIG. 7, the channel current in the write and erase operations is set by the potential of the select gate line SGL, on the other hand, on the conditions of FIG. 8, the channel current is by the potential of the bit line BL. These two ways to set the channel current are the same as those in FIG. 2, in which the setting of the channel current is performed by the voltage Vsg of the select gate electrode SG (upper stage) and the voltage Vd of the drain region MD (lower stage).

(2-1) An array operation of the write and/or erase operation under the voltage conditions shown in FIG. 7 will be described. Both the write and erase operations according to the present invention requires a condition in which a current flows in a channel, i.e., a select transistor is an ON state.

Therefore, the write and/or erase operation can be performed only on the memory cell in which the select transistor is turned on by the bit line BL and the select gate line SGL which are perpendicular to each other.

Under the write condition and erase condition in bit erase as shown in FIG. 7, the voltage of the select gate line SGL0 is boosted from 0 V to approximately 0.7 V, and only the voltage of the bit line BL0 is dropped from 1.5 V to 0 V. As a result, the potential of the select gate line SGL on only the memory cell BIT1 shown in FIG. 6 is higher than that of the bit line BL, whereby the select transistor is turned on and the write and/or erase operations are performed.

Namely, the write and erase operations can be performed bit by bit (single memory cell). In this write and/or erase operation, as a matter of course, the potential of the source line SL0 with which a selected cell is connected is set at 6 V in the write operation and at 7 V in the erase operation, and that of a memory gate line MGL0 is set at 10 V in the write operation and at −8 V in the erase operation. At this time, the respective potentials must meet the write and/or erase conditions shown in FIG. 2.

Meanwhile, at this time, a potential of 0.7 V is applied also to the select gate electrode SG of another memory cell BIT2 or the like connected with the select gate line SGL0, with which the memory cell BIT1 is connected. However, when a potential (1.5 V in FIG. 7) applied to the bit line BL1 or the like connected with the above-mentioned another memory cell is equal to or higher than the potential (0.7 V) of the select gate line SGL0, the select transistor of the another memory cell can be prevented from being turned on. That is, the erasing of an unselected memory cell can be prohibited.

As an erase unit, not only bit erase but also word erase, block erase in which data held by memory cells connected with a plurality of word lines, or the like can also be used in the memory array having the same structure.

In the case of performing the erase operation per word erase, if, for example in the memory array in FIG. 6, only the select gate line SGL0 is set at 0.7 V and all the bit lines BL at 0 V and the source line SL0 at 7 V and the memory gate line MGL0 at −8 V, then data held by memory cells WORD1 (portion surrounded by a broken line) connected with the select gate line SGL0 can be simultaneously erased.

In the case of performing the erase operation in block erase, the voltages of all select gate lines SGL in a block (for example, n×m memory cells) may be boosted to 0.7 V; the voltages of all the bit lines BL dropped to 0 V; a voltage of 7 V applied to all the source lines SL; and a voltage of −8 V applied to all the memory gate lines MGL.

On the above conditions, a channel current is set by the potential of the select gate line SGL. It is also possible that the channel current is set by the potential of the bit line BL shown in FIG. 8, i.e., by the potential of the drain region MD. For example, in order that write and erase are performed only on the memory cell BIT1, the potentials of the select gate line SGL0 and the bit line BL0, which are connected with the memory cell BIT1, are set respectively at 1.5 V and 0.8 V and the potentials of the select gate lines SGL1 to SGL3 and the bit line BL1, which are not connected with the memory cell BIT1, are set respectively at 0 V and 1.5 V. On these bias conditions, the potential of the select gate line SGL is higher than that of the bit line BL only for the selected memory cell BIT1, which make it possible that write and erase operations are performed only on the memory cell BIT1.

(2-2) Next, read conditions of the memory array will be described. The read operation requires turning on a select transistor similarly to the write and/or erase operations. A read cell is selected by the select gate line SGL and the bit line BL.

In the read operation, there are two cases, i.e., one case where the potential between the source and the drain is applied in a reverse direction to the direction in the write and/or erase operation and the other case where applied in a forward direction thereto.

In the former, the potentials of the select gate line SGL0 and the bit line BL0 which are connected with the selected cell BIT1 are set at 1.5 V; those of the select gate lines SGL1 to SGL3 and the bit line BL1 which are not connected with the selected cell are set at 0 V; and all the potentials of the source lines SL0 and SL1 are set at 0 V.

In the latter, the potentials of the select gate line SGL0 and the bit line BL0 which are connected with the selected cell BIT1 are set respectively at 1.5 V and 0 V; those of the select gate lines SGL1 to SGL3 and the bit line BL1 which are not connected with the selected cell are set respectively at 0 V and 1.5 V; and all the potentials of the source lines SL0 and SL1 are set at 1.5 V.

To obtain a larger read current, the potential of the memory gate line MGL may be set so that a voltage of 1.5 V is applied only to the memory gate line MGL0 with which the selected cell is connected. Under the voltage conditions as shown in FIGS. 7 and 8, the read operation in both the reverse and forward directions is performed on the memory cell BIT1 in FIG. 6.

Figure 9:
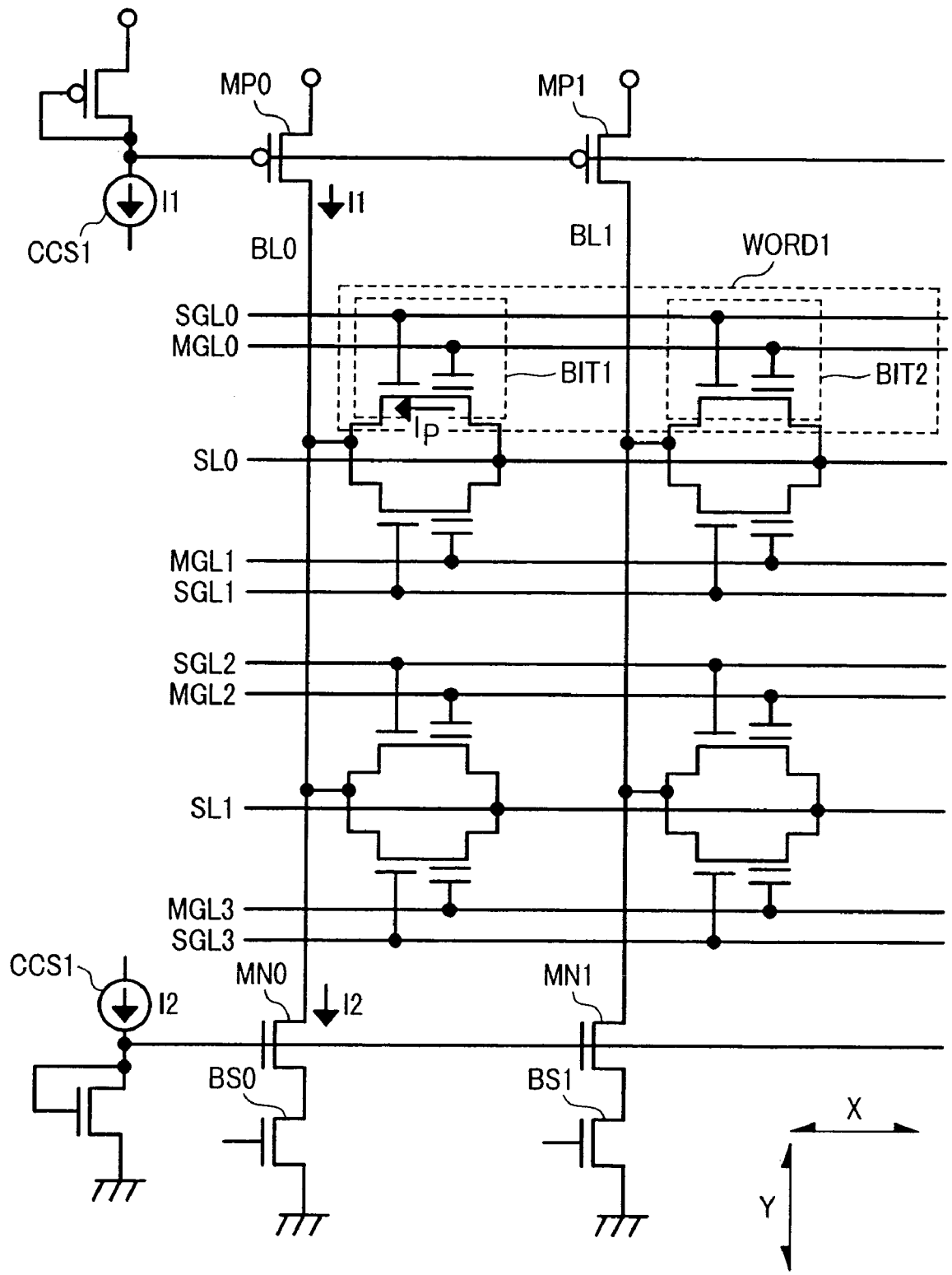
FIG. 9 is a circuit diagram for realizing write and erase operations at a constant channel current in the memory array in FIG. 6.

(2-3) The write and/or erase operations in which a constant voltage is applied are described in (2-1). Here, there will be described a method of performing write and/or erase operations so that the channel current in the write/erase operations becomes constant by using a circuit. An example of a circuit configuration for realizing write and/or read operations performed by the constant channel current is shown in FIG. 9. A mirror circuit constituted by a PMOS transistor is arranged at one end of each of the bit lines BL0 and BL1, and a mirror circuit constituted by a NMOS transistor is arranged at the other ends.

An operation performed when data held by the memory cell represented by BIT1 is erased by the constant channel current will be described. The constant-channel-current write operation is also performed by the same method as the erase operation.

First, the voltages shown in FIG. 8 are applied to the lines except the bit lines BL0 and BL1, and a current I1 is carried in a constant current source CCS1, and a current I2, which is larger than the current I1, is carried in a constant current source CCS2. In this case, when a bit-line-select switching transistor BS0 of the bit line BL0 with which the selected cell BIT1 is connected is turned on, the current I2 flows through an NMOS transistor MN0 from the bit line BL0 to the ground, and the current I1 flows through a PMOS transistor MP0 into the bit line BL0, by the principle of mirror circuit. The difference current between the currents I2 and I1 is supplied to the bit line BL through the memory cell BIT1, only in which the select transistor is turned on among the memory cells connected with the bit line BL0. More specifically, a current Ip (=I2−I1) flows in the channel of the selected cell BIT1. In this manner, the constant-current erase operation can be performed with a channel current determined by the difference between the currents I2 and I1.

On the bit line BL1 with which the selected cell is not connected, while the bit-line-select switching transistor is turned off, the potential of the bit line BL1 is increased through an PMOS transistor MP1 up to 1.5 V, whihc is equal to or higher than the potential (SG0 is set at 1.5 V and SG1 to SG3 at 0 V) of the select transistor and so the select transistors of all the memory cells connected with the bit line BL1 are turned off. Therefore, the erase operation can be prohibited. Note that when the potential of the bit line BL1 is lower than 1.5 V by junction leakage or the like of the bit line, the select transistors of the memory cells represented by the symbol "BIT2" are turned on and a current flows in the channel, which results in occurrence of the weak erase operation. This weak erase operation can be prevented from occurring by supplying a current through the PMOS transistor MP1 by the mirror circuit.

The above method is a method of performing the write and/or erase operations at a constant channel current value in bit erase. In the case where the write and/or erase operations are performed in word erase, for example in the memory array shown in FIG. 9, by turning on all the bit-line-select switching transistors BS0 and BS1, data held by memory cells WORD1 (portion surrounded by a broken line) connected with the select gate line SGL0 can be simultaneously erased.

In the case where the write and/or erase operations are performed in block erase, all of the bit-line-select switching transistors in the block (for example, n×m memory cells) are turned on, and the difference between the current I2 of the constant current source CCS2 and the current I1 of the constant current source CCS1 is made equal to a product of a channel current Ip in the write or erase operation and the number m of memory cells connected with the bit line. That is, "I2−I1=Ip×m" is satisfied. In this manner, a channel current having a value of "Ip" can be carried per cell in performing the erase operation.

Figure 10:
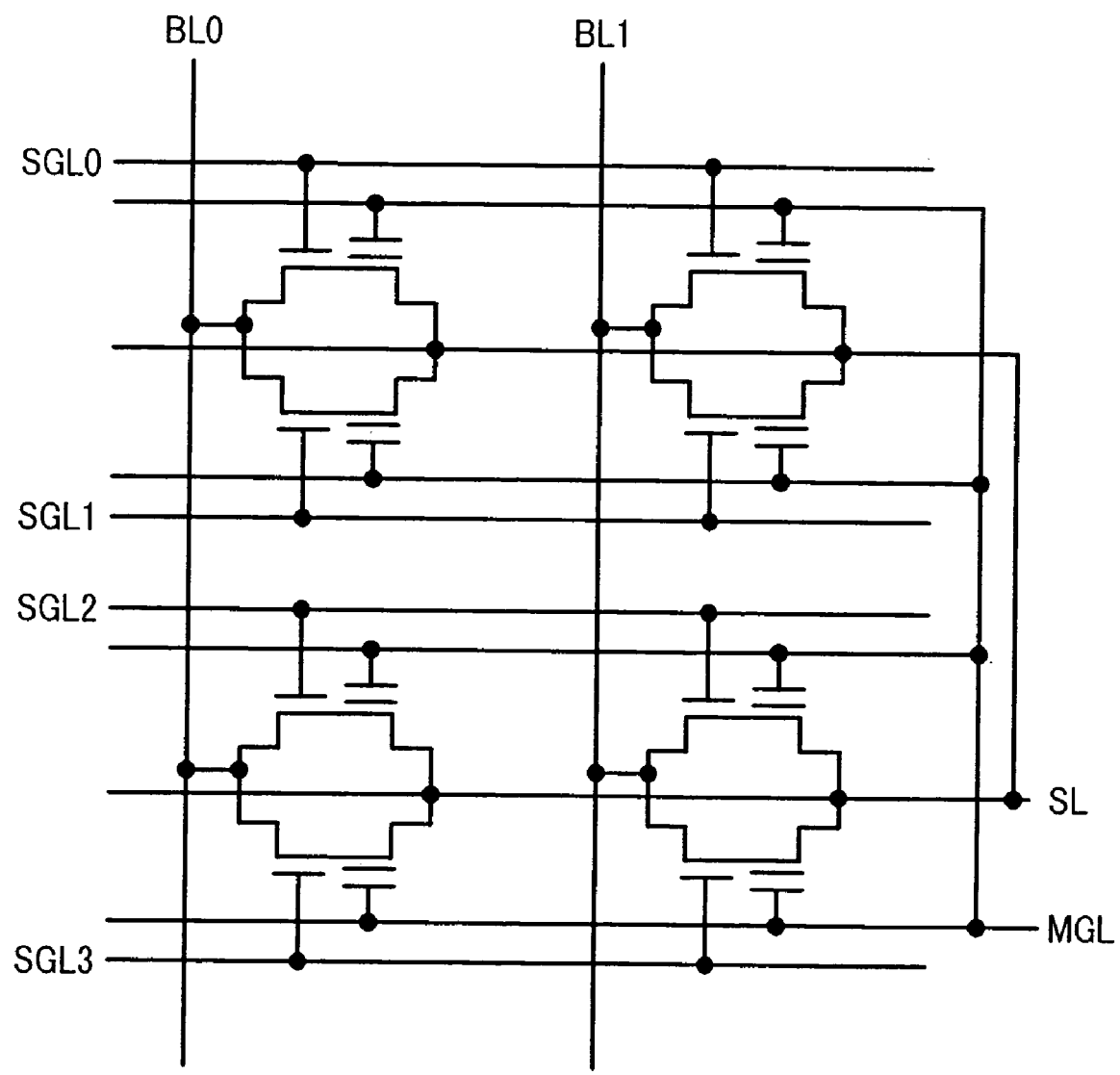
FIG. 10 is a circuit diagram showing another nonvolatile semiconductor memory array according to an embodiment of the present invention.

(3) Then, another memory array configuration will be described. FIG. 10 is a circuit diagram showing another nonvolatile semiconductor memory array according to an embodiment of the present invention.

In comparison with the memory array configuration shown in FIG. 6, a common source line SL is used by connecting a plurality of source lines. Additionally, a common memory gate line MGL is used by connecting a plurality of memory gate lines.

Since the common source line SL and the common memory gate line MGL are respectively used, the number of high-voltage drivers for driving the respective lines is reduced and an area of the chip can be reduced. Wiring layers constituting the memory array may be shared with either of the source line SL and the memory gate line MGL.

FIGS. 11 and 12 show conditions of voltages applied to respective wiring layers in write, erase, and read operations in the memory array in FIG. 10. FIGS. 11 and 12 are respective conditions used in the case where the channel current values in the write and/or erase operations are set by the potential of the select gate line SGL and the case where set by the potential of the bit line BL.

The voltages applied to the bit line BL and the select gate line SGL are exactly equal to those in the memory array shown in FIG. 6, and the voltages applied to the common source line SL and the common memory gate line MGL are equal to those applied to the selected cell BIT1 in the memory array shown in FIG. 6.

More specifically, voltages of 6 V and 10 V are respectively applied to the source line SL and the memory gate line MGL in the write operation, and voltages of 7 V and −8 V are respectively applied to them in the erase operation. In the reverse-direction read operation, voltage of 0 V and 1.5 V are respectively applied to the source line SL and the memory gate line MGL, and, in the forward-direction read operation, voltages of 1.5 V and 1.5 V are respectively applied to them.

(4) Subsequently, still another memory cell array configuration will be described. FIG. 13 is a circuit diagram showing another nonvolatile semiconductor memory array according to this embodiment.

In comparison with the memory array configuration shown in FIG. 6, in the case shown in FIG. 13, the position of the memory transistor is replaced with that of the select transistor, and a bit line BL is connected with a diffusion layer (drain region) on the memory transistor side and a source line SL is connected with a diffusion layer (source region) on the select transistor side.

FIGS. 14 and 15 show conditions of voltages applied to respective wiring layers in write, erase, and read operations in the memory array in FIG. 13. FIGS. 14 and 15 are respective conditions used when channel current values in the write and/or erase operations are set by the potential of the select gate line SGL and conditions used when set by that of the bit line BL.

In the memory array shown in FIG. 6, a voltage applied to the source line SL is applied to the bit line BL and when a voltage applied to the bit line BL is applied to the source line SL. The write, erase, and read operations are the same as those in the memory cell array in FIG. 6.

More specifically, under the write conditions shown in FIG. 14 and the erase conditions used when the erase operation is performed in bit erase, the voltage of only the select gate line SGL0 is boosted from 0 V to approximately 0.7 V and that of only the source line SL0 is dropped from 1.5 V to 0 V. As a result, on only the selected cell BIT1 shown in FIG. 13, the potential of the select gate line SGL is larger than that of the source line SL, whereby the select transistor is turned on and the write and/or erase operations are performed.

Namely, the write and/or erase operations are performed bit by bit (single memory cell). In this write and/or erase operations, as a matter of course, the potential of the bit line BL0 with which a selected cell is connected is set at 6 V in the write operation and at −7 V in the erase operation, and that of the memory gate line MGL0 is set at 10 V in the write operation and at −8 V in the erase operation. At this time, the respective potentials must meet the write and/or erase conditions shown in FIG. 2.

In this case, potentials of 0.7 V and 0 V are respectively applied to the select gate electrode SG and the source region MS of another memory cell BIT2 or the like connected with the select gate line SGL0 with which the selected cell BIT1 is connected. However, the potential (0.8 V) of the source line SL0 is equal to a potential applied to the bit line BL1 or the like connected with the above-mentioned another memory cell. Therefore, a current can be prevented from flowing between the source region and the drain region. That is, the erase operation of an unselected memory cell can be prohibited.

Further, the read conditions shown in FIGS. 14 and 15 include voltage conditions that are opposite to those in the "reverse-direction read" and "forward-direction read" operations in FIG. 6 because the positions of the memory transistor and the select transistor in this memory array are opposite to those in the memory array in FIG. 6.

As described above, the voltage conditions of the memory operations have been shown in FIGS. 2, 7, 8, 11, 12, 14, and 15. However, these conditions are only examples, and the present invention is not limited to the numerical values shown in these drawings. Also in the memory cell arrays shown in FIGS. 10 and 13, the write and/or erase operations by the constant channel current may be performed by employing the circuit system shown in FIG. 9.

Figure 16:
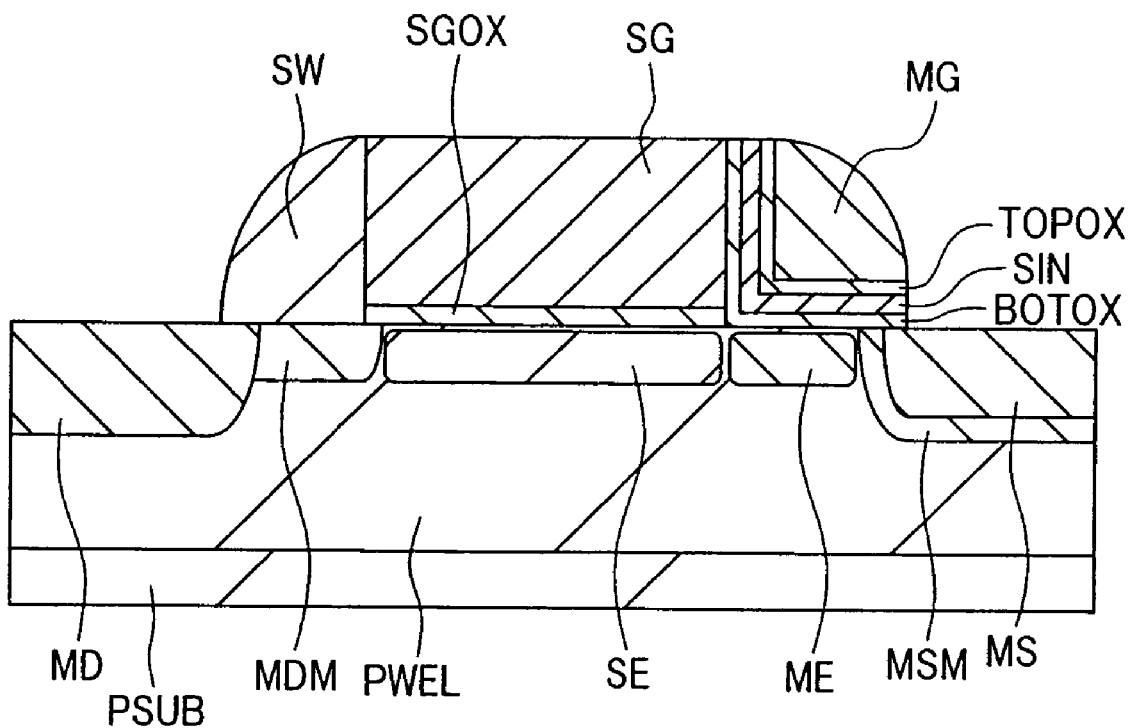
FIG. 16 is a sectional view showing a principal portion of a nonvolatile semiconductor memory device (flash memory) according to an embodiment of the present invention.

(5) Subsequently, a concrete configuration of the memory cell, which realizes an erase operation using the above-mentioned hot hole injection method and is capable of speeding up the erase and/or read operations and improving the reliability of the write/erase endurance characteristics and high-temperature data retention characteristics, will be described below with reference to FIG. 16.

To perform the erase operation, when a negative voltage is applied to the memory gate electrode MG, a current must flow between the source and the drain.

For this reason, the channel region (ME) of the memory transistor must be of an n type, or the channel length of the memory transistor must be shortened.

Since both processes as described above contribute to an increase in a read current, the memory cell that adopts the erase method according to the present invention is suitable for a high-speed read operation.

Additionally, the erase method according to the present invention uses hole injection, and can obtain a large read current by the fact that a threshold voltage after the erase operation is lower than a neutral threshold voltage. Therefore, also with respect to this point, the erase method is suitable for a high-speed read operation.

The erase speed is higher than that of a tunneling erase method because the hot carrier injection is used. Further, when the n-type impurity concentration of the channel region (ME) of the memory transistor is made high, or when the channel length of the memory transistor is shortened, the erase operation with further higher speed can be performed.

In the channel region SE of one select transistor, an impurity concentration is set so that the threshold voltage of the select transistor is higher than the neutral threshold voltage of the memory transistor. The neutral threshold voltage of the memory transistor means a threshold voltage obtained when no charge is accumulated in the charge accumulation region.

When the threshold voltage of the select transistor is excessively high, a large read current cannot be obtained. When the threshold voltage is excessively low, the transistor is not completely turned off even if the gate voltage of the transistor is 0 V, and a leakage current hinders a normal read operation. Therefore, the threshold voltage of the select transistor is preferably set to be low within a range of positive voltage.

Next, impurity profiles of the drain region MD and the source region MS will be described.

First, since the maximum voltage applied to the drain region MD in a memory operation is approximately 1.8 V, a source-drain structure of the MOS transistor to be driven at 1.8 V is preferably employed. For example, the drain region MD may be constituted by a high concentration n-type doped region having a concentration almost equal to that of the MOS transistor operated at 1.8 V. Further, there may be employed an LDD structure in a low concentration n-type doped region MDM is provided at the end of the drain region MD and on the gate electrode side.

The other source region MS is also constituted by a higher n-type doped region. Further, since voltages of 6 V and 7 V are respectively applied to the source region MS in the write operation and the erase operation, a low concentration n-type doped region MSM is provided at the periphery of the high concentration n-type doped region (MS) to obtain a double doped region or the like, so that a high-breakdown-voltage structure is preferably obtained.

When the impurity profile of the source region MS is of an electric field concentration type, an erroneous write operation may be caused by high electric field at an end of the source region MS. This is because a high voltage of 6 V is applied to the source region even in unselected cell such as the memory cell BIT2 when the write operation of the selected cell BIT1 is performed in FIG. 6. For this reason, the source impurity profile is preferably of an electric field moderation type.

The thicknesses of the silicon nitride film SIN below the memory gate electrode MG, and those of the top and bottom oxide films TOPOX and BOTOX respectively located on upper and lower sides of the silicon nitride are important factors for determining memory characteristics.

In the memory cell adopting the erase method according to the present invention, since the hot carrier injection is used in both write and erase operations, the oxide films respectively located on and under the silicon nitride film can be increased in thickness. The thickness of the silicon nitride film SIN is set at approximately 3 to 15 nm, and those of the top and bottom oxide films TOPOX and BOTOX disposed on and under the silicon nitride film are set at approximately 3 to 10 nm. If the thicknesses of the oxide films TOPOX and BOTOX are respectively set at 3 nm or more, it is possible to suppress a change of accumulated charges caused by a tunneling phenomenon.

Thus, by increasing the thicknesses of the top and bottom oxide films of the silicon nitride film, retention characteristics are improved especially at a high temperature and deterioration of the retention characteristics after the write/erase cycles can be also suppressed.

Figure 17:
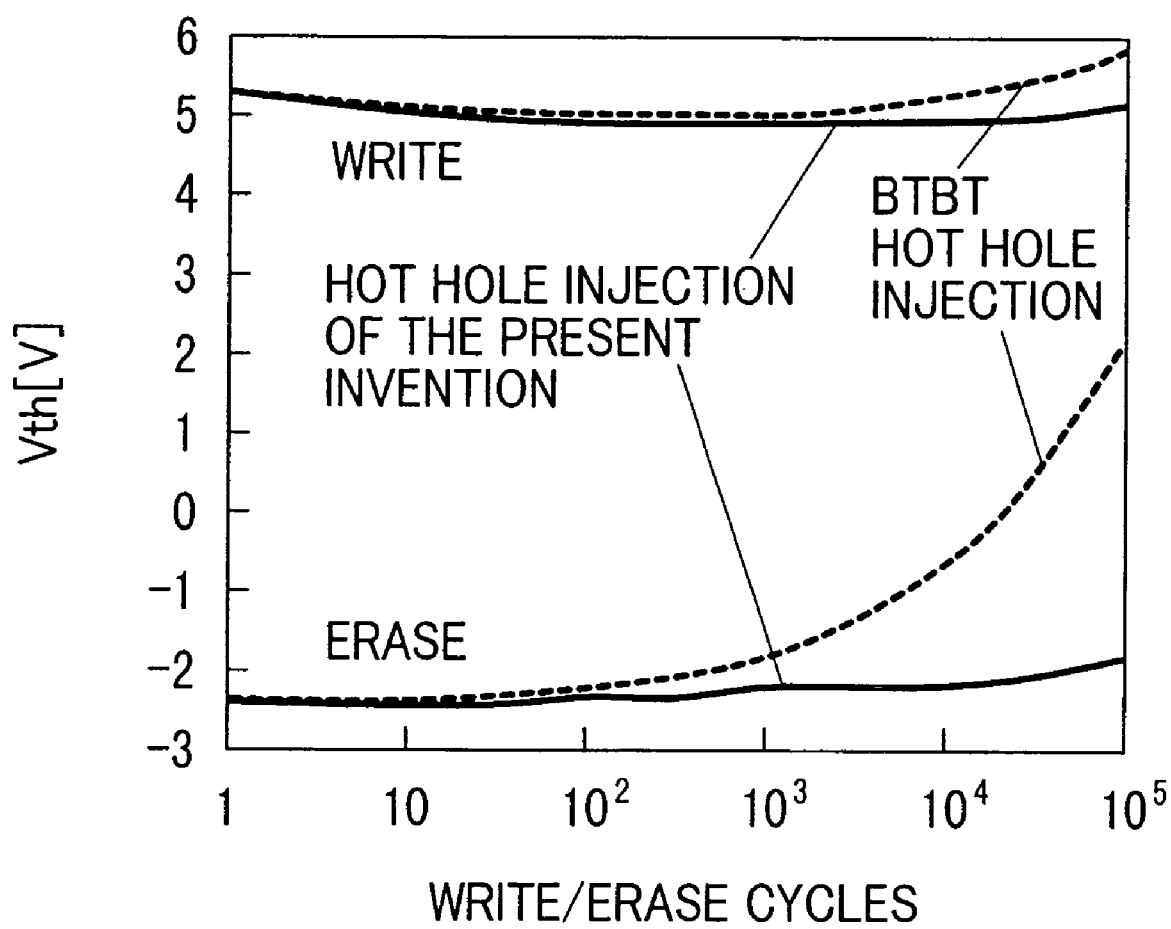
FIG. 17 is a graph showing write/erase endurance characteristics in a nonvolatile semiconductor memory device (flash memory) according to the embodiment of the present invention and those in the nonvolatile semiconductor memory device using the BTBT hot hole injection erase method disclosed in the U.S. Pat. No. 5,969,383 document.

FIG. 17 shows the write/erase endurance characteristics of a memory cell using the erase method according to the present invention. The endurance characteristics are compared with that of a memory cell using a BTBT hot hole injection erase method described in Patent Document 2 (U.S. Pat. No. 5,969,383). In the BTBT hot hole injection erase method, the position where electrons are injected in the write operation is slightly deviated from that where holes are injected in the erase operation. Therefore, when the write and erase operations are repeated in a write/erase cycling test, the threshold voltage on the erase operation side gradually increases. In contrast, in the erase method according to the present invention, since holes are injected at a position where electrons are injected, the increase of the threshold voltage caused by the write/erase cycling operation can be suppressed.

(6) Subsequently, an example of a method of manufacturing a nonvolatile semiconductor memory device (memory cell) shown in FIG. 16 will be described below with reference to FIGS. 18 to 26. FIGS. 18 to 26 are sectional views showing a principal portion of a substrate in a method of manufacturing a nonvolatile semiconductor memory device according to this embodiment. In the respective FIGS., there are shown respective sections of two memory cell regions having a source region in common.

Figure 18:
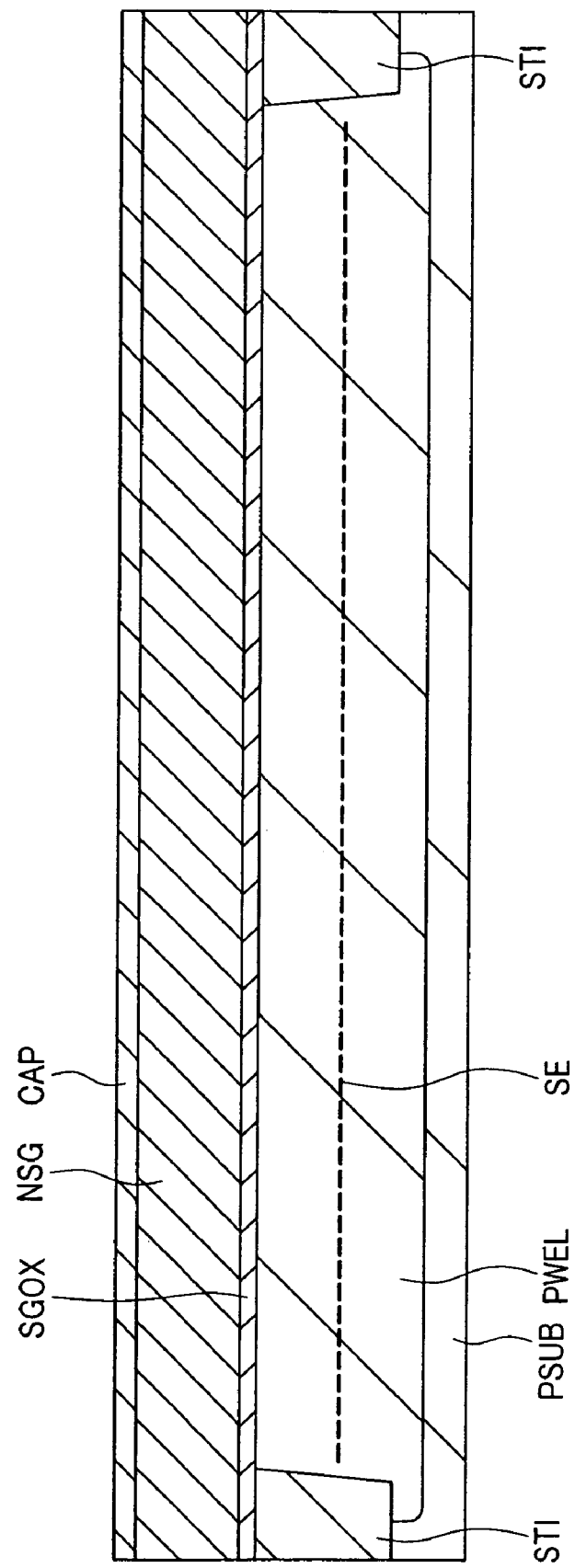
FIG. 18 is a sectional view showing a principal portion of a substrate in a method of manufacturing a nonvolatile semiconductor memory device according to an embodiment of the present invention.

FIG. 18 will be described first. A shallow trench isolation STI is formed on a p-type silicon substrate PSUB and a p-type well region PWEL to be a memory cell region is formed.

On the surface of the p-type well region PWEL, a p-type impurity region (channel region) SE for adjusting the threshold value of a select transistor is formed. After the surface of the silicon substrate is subjected to a cleaning process, a gate oxide film SGOX of the select transistor is formed by thermal oxidation. On the gate oxide film SGOX, an n-type poly-silicon layer NSG (approximately 100 nm) to be a select gate electrode and a silicon oxide film CAP for protecting the select gate electrode are sequentially deposited.

Figure 19:
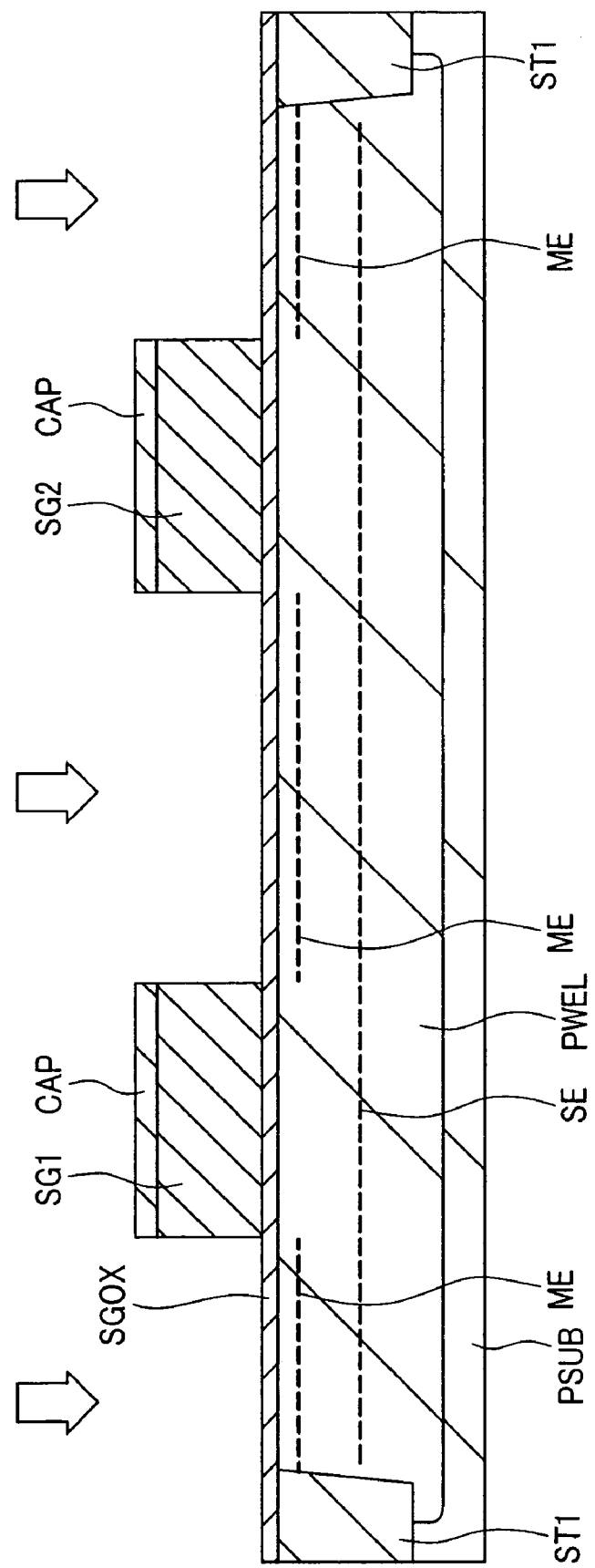
FIG. 19 is a sectional view showing a principal portion of a substrate in a method of manufacturing a nonvolatile semiconductor memory device according to an embodiment of the present invention.

Next, FIG. 19 will be described. The n-type poly-silicon layer NSG formed over the silicon substrate in FIG. 18 is processed by using photolithography and dry-etching techniques, and select gate electrodes SG1 and SG2 of the select transistor are formed. Each of these gate electrodes extends in the direction of depth in the drawings and constitutes a line pattern. This pattern corresponds to the select gate line SGL of the memory array (see FIG. 6 or the like). Note that, to prevent unnecessary damage to the surface of the silicon substrate in forming this pattern, the dry etching is stopped when the surface of the thermal oxide film (SGOX) is exposed. Then, an n-type doped region ME for adjusting a threshold voltage is formed in the channel region of the memory transistor on the surface of the silicon substrate. For example, the impurity concentration of the n-type doped region ME is approximately $7 \times 10^{12}/cm^2$.

Figure 20:
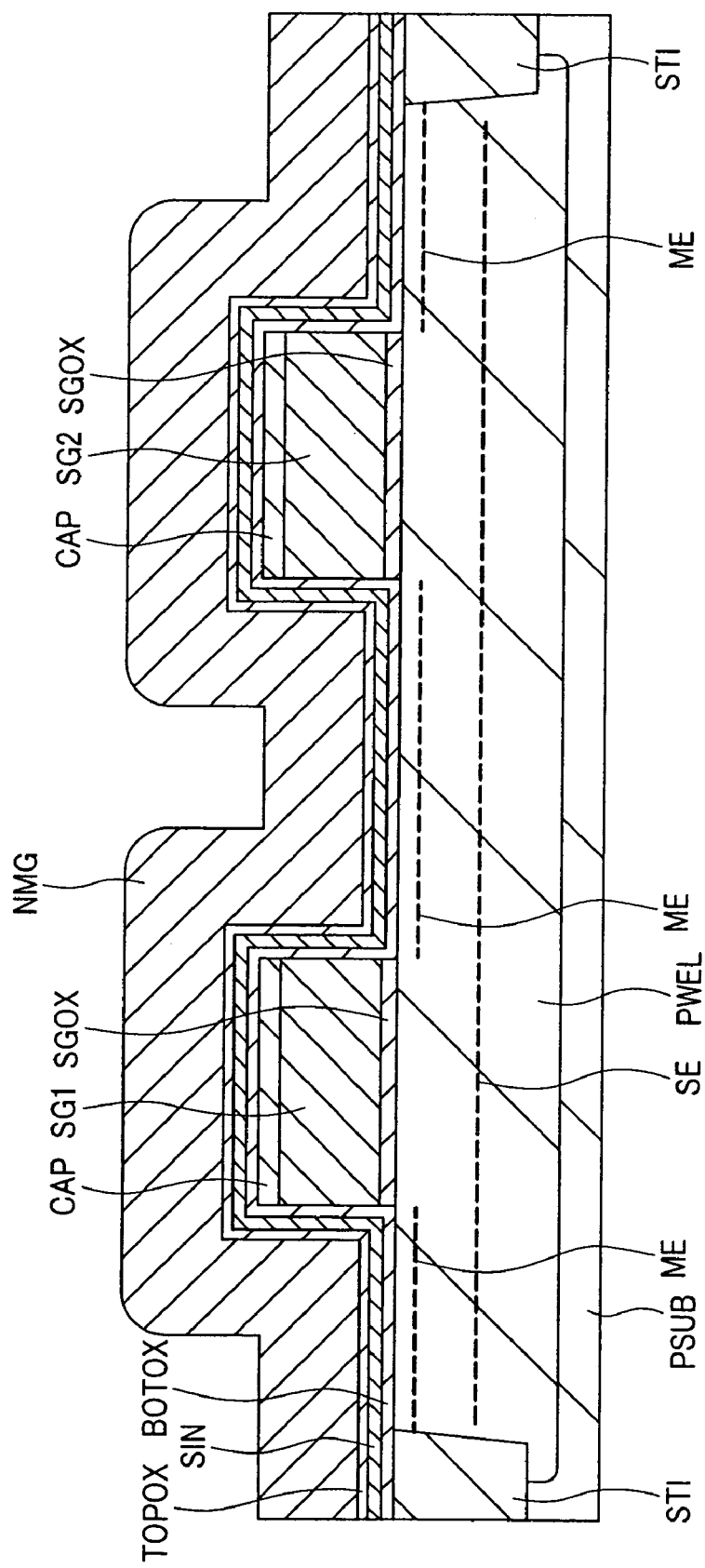
FIG. 20 is a sectional view showing a principal portion of a substrate in a method of manufacturing a nonvolatile semiconductor memory device according to an embodiment of the present invention.

Next, FIG. 20 will be described. The thermal oxide film (SGOX) left to protect the surface of the silicon substrate is removed by hydrofluoric acid, and an ONO (Oxide-Nitride-Oxide) film to be a gate insulator film of the memory transistor is stacked. Note that, when the thermal oxide film (SGOX) is removed, the silicon oxide film CAP on the select gate electrode SG may be simultaneously removed.

When the ONO film is formed, for example, the bottom oxide film BOTOX (with a thickness of approximately 3 to 10 nm) is formed by thermal oxidization, and thereafter a silicon nitride film SIN is deposited by a vapor-phase growth method, and further the top oxide film TOPOX is formed by the vapor-phase growth method and thermal oxidization. At this time, the thicknesses of the bottom oxide film BOTOX and the top oxide film TOPOX are preferably 3 nm or more so that the tunneling phenomenon does not easily occur.

Subsequently, an n-type poly-silicon layer NMG (approximately 100 nm) to be a memory gate electrode MG is deposited on the ONO film.

Figure 21:
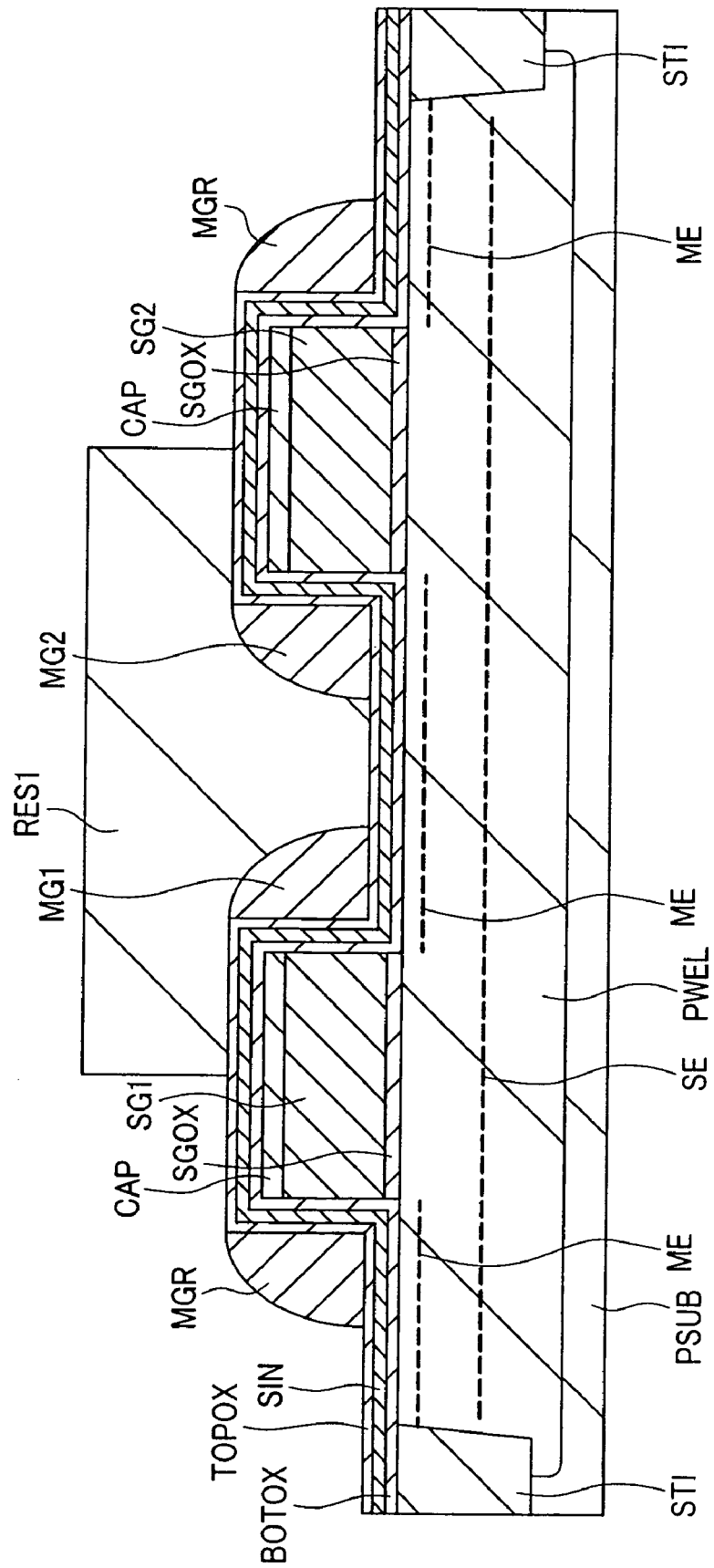
FIG. 21 is a sectional view showing a principal portion of a substrate in a method of manufacturing a nonvolatile semiconductor memory device according to an embodiment of the present invention.

Then, FIG. 21 will be described. The n-type poly-silicon layer NMG deposited as shown in FIG. 20 is removed by an anisotropic etching technique until the top oxide film TOPOX is exposed, and memory gate electrodes MG1 and MG2 are respectively formed as sidewalls of the select gate electrodes SG1 and SG2. The spacer width of each of the memory gate electrodes MG1 and MG2 is approximately 90 nm. At this time, also on the side of select gate electrodes SG1 and SG2, opposite to the side of the memory gate electrodes MG1 and MG2, sidewall spacers MGR of poly-silicon are formed.

Then, to remove the sidewall spacers MGR, the memory gate electrodes MG1 and MG2 are covered with a photoresist RES1 by using the photolithography technique. At this time, the photoresist RES1 is formed so that the ends thereof are located on the select gate electrodes SG1 and SG2.

Next, FIG. 22 will be described. The polysilicon sidewall spacers MGR formed in FIG. 21 are removed by the dry etching technique, and further the photoresist RES1 is removed. Subsequently, the exposed top oxide film TOPOX and the silicon nitride film SIN are removed by the hydrofluoric acid and a heated phosphoric acid, respectively. Thereafter, ions of low concentration n-type impurity are implanted to form a low concentration n-type doped region MDM in a drain section. In this ion implantation, a low concentration n-type doped region MDMS is also formed in a source section.

Figure 22:
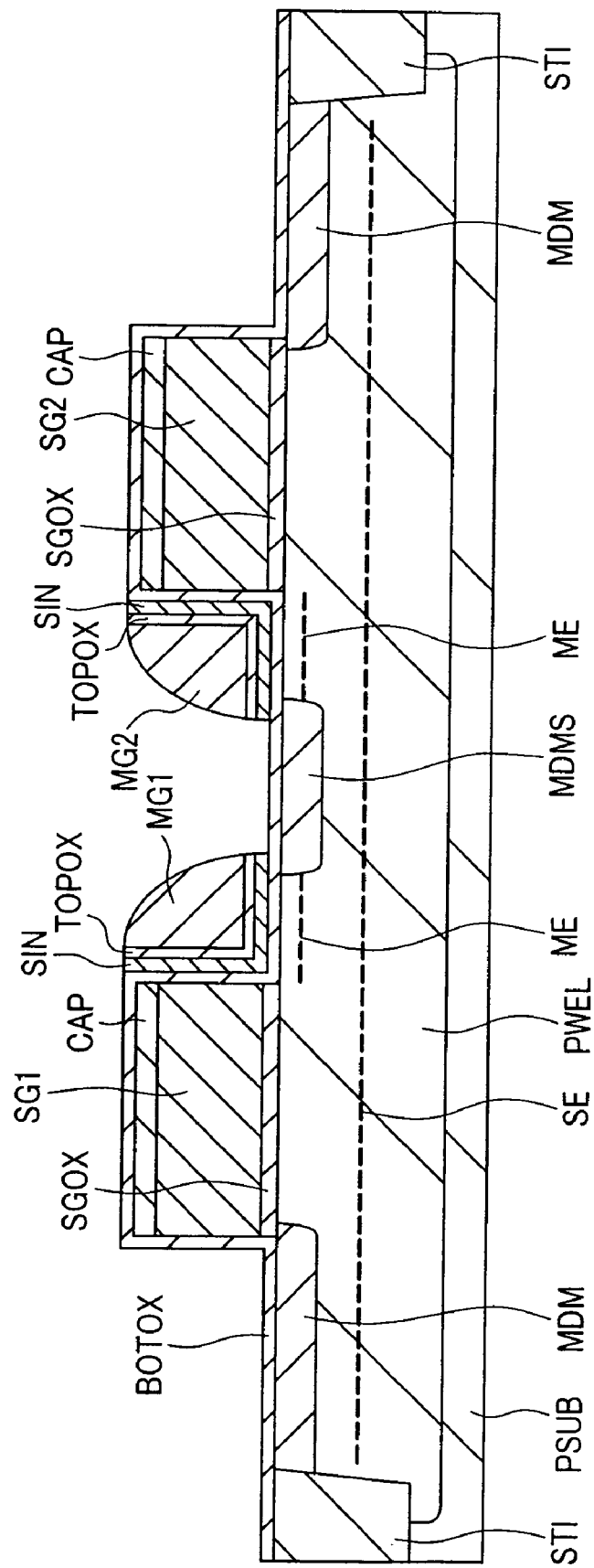
FIG. 22 is a sectional view showing a principal portion of a substrate in a method of manufacturing a nonvolatile semiconductor memory device according to an embodiment of the present invention.

The removal of the polysilicon sidewall spacers MGR in FIG. 22 is the reason for forming the low concentration n-type doped region MDM in the drain section. For example, in FIG. 19, if, after forming the n-type doped region ME, an upper portion of the source section is covered with a photoresist by using a photolithography technique and then the low concentration n-type doped region MDM is formed in the drain section, the sidewall spacers MGR need not be removed.

Then, FIG. 23 will be described. After exposed portions of the bottom oxide film BOTOX in the ONO film are removed by hydrofluoric acid, an oxide film is deposited and etched by using an anisotropic etching technique, and thereby the sidewall spacers SW are formed on the sidewalls of the select gate electrodes SG1 and SG2. At this time, silicon oxide SWR is left on the sidewalls of the memory gate electrodes MG1 and MG2.

Next, FIG. 24 will be described. A photoresist RES2 is formed by a photolithography process so that it has an opening in the source section of the memory transistor and an edge of the opening is located on the select gate electrodes SG1 and SG2. Subsequently, the silicon oxide SWR left on each sidewall of the memory gate electrodes MG1 and MG2 in FIG. 23 are removed by hydrofluoric acid. Furthermore, by performing ion implantation of an n-type impurity, a low concentration n-type doped region MSM is formed in the source section of the memory transistor.

Figure 24:
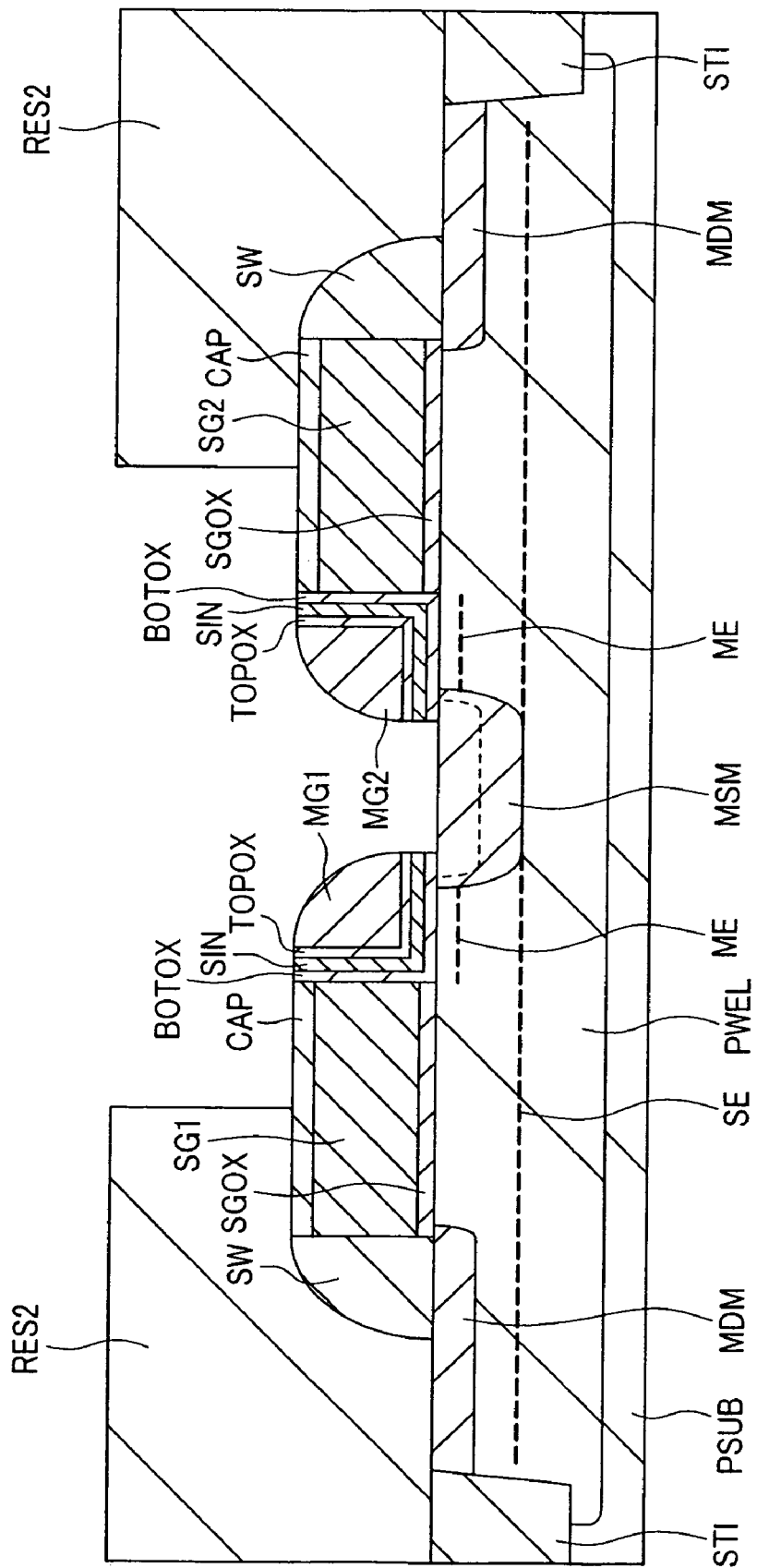
FIG. 24 is a sectional view showing a principal portion of a substrate in a method of manufacturing a nonvolatile semiconductor memory device according to an embodiment of the present invention.
Figure 25:
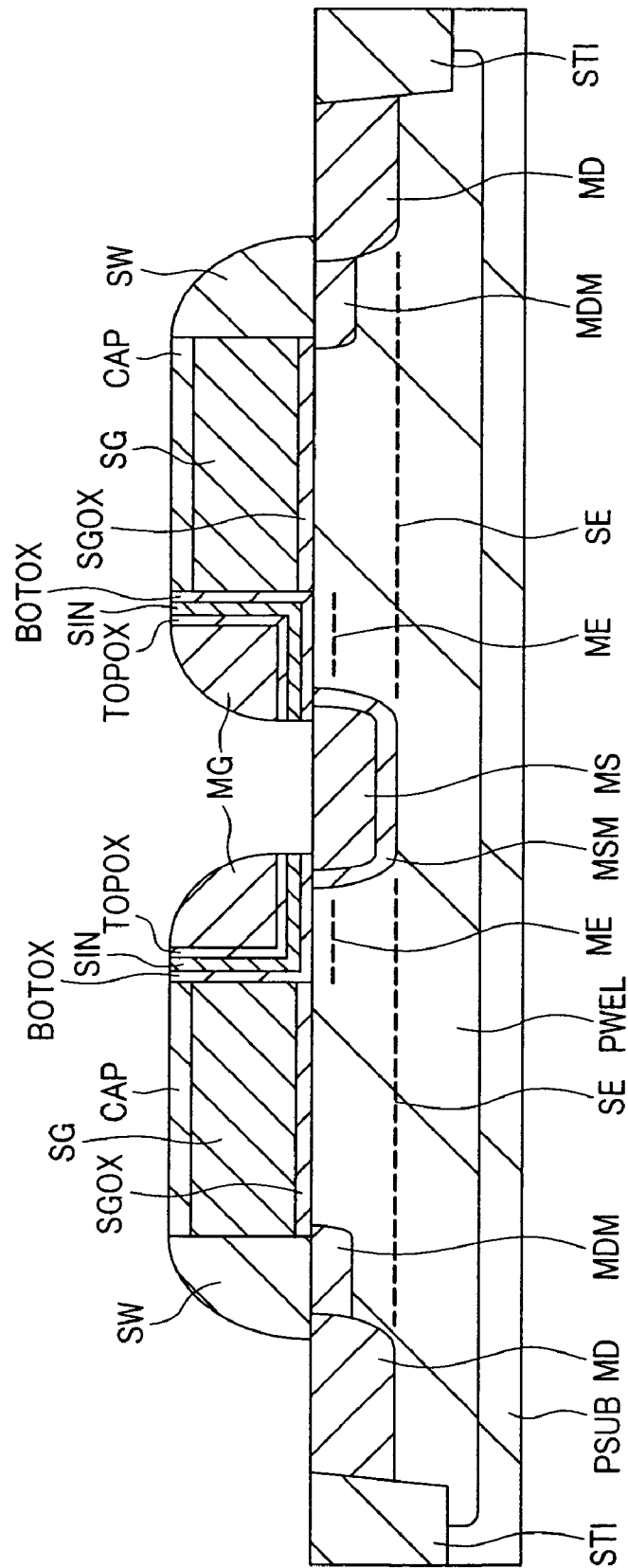
FIG. 25 is a sectional view showing a principal portion of a substrate in a method of manufacturing a nonvolatile semiconductor memory device according to an embodiment of the present invention.

Then, FIG. 25 will be described. By removing the photoresist RES2 coated in FIG. 24 and performing the ion implantation of an n-type impurity, a drain region MD of the select transistor and a source region MS of the memory transistor are formed. A part of the low concentration n-type doped region MDMS formed in the source section in FIG. 22 serves as a high concentration n-type doped region, and the source region MS serving as a high concentration n-type doped region and the low concentration n-type doped region MSM constitute a DDD (Double Diffused Drain) structure.

Next, FIG. 26 will be described. An interlayer dielectric INS1 is deposited over the entire surface of the silicon substrate. A contact hole is formed on the drain region MD by using the photolithography technique and the dry etching technique, and a metal layer serving as a first metal layer is deposited. Thereafter, a first metal layer M1 is formed by using the photolithography technique and the etching technique.

Figure 26:
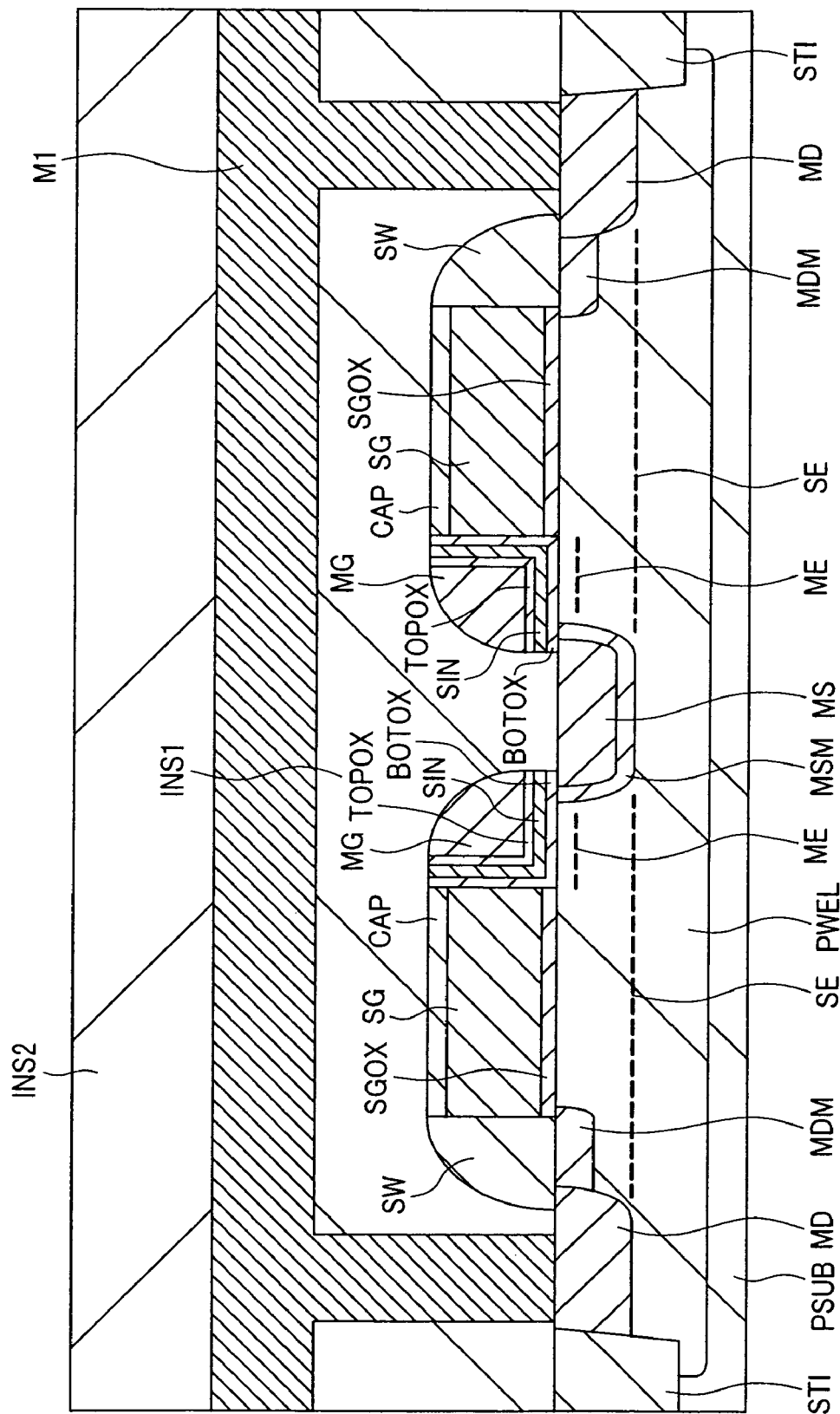
FIG. 26 is a sectional view showing a principal portion of a substrate in a method of manufacturing a nonvolatile semiconductor memory device according to an embodiment of the present invention.

As shown in FIG. 26, the memory gate electrodes MG and the select gate electrodes SG extend, for example, in a direction perpendicular to the paper face, and the first metal layer M1, which is connected with the drain region MD and serves as the bit line BL, extends in a direction perpendicular to the memory gate electrode MG and the select gate electrode SG (see FIG. 6 or the like). Note that, in the circuit diagram in FIG. 13, the positions of the memory gate electrode MG and the select gate electrode SG are replaced with each other.

Then, an interlayer dielectric INS2 is deposited. Although not shown hereinafter, a contact hole is formed in the interlayer dielectric INS2 and a conductive film is deposited and is patterned to form a wiring layer. Thus, by repeating the step of forming the interlayer dielectric and the metal layer, a multilevel metal layer can be formed.

(7) Subsequently, an example of another memory cell structure for realizing the erase method according to the present invention will be described with reference to FIGS. 27 to 30. FIGS. 27 to 30 are sectional views showing a principal portion of another nonvolatile semiconductor memory device (flash memory) according to this embodiment.

Figure 27:
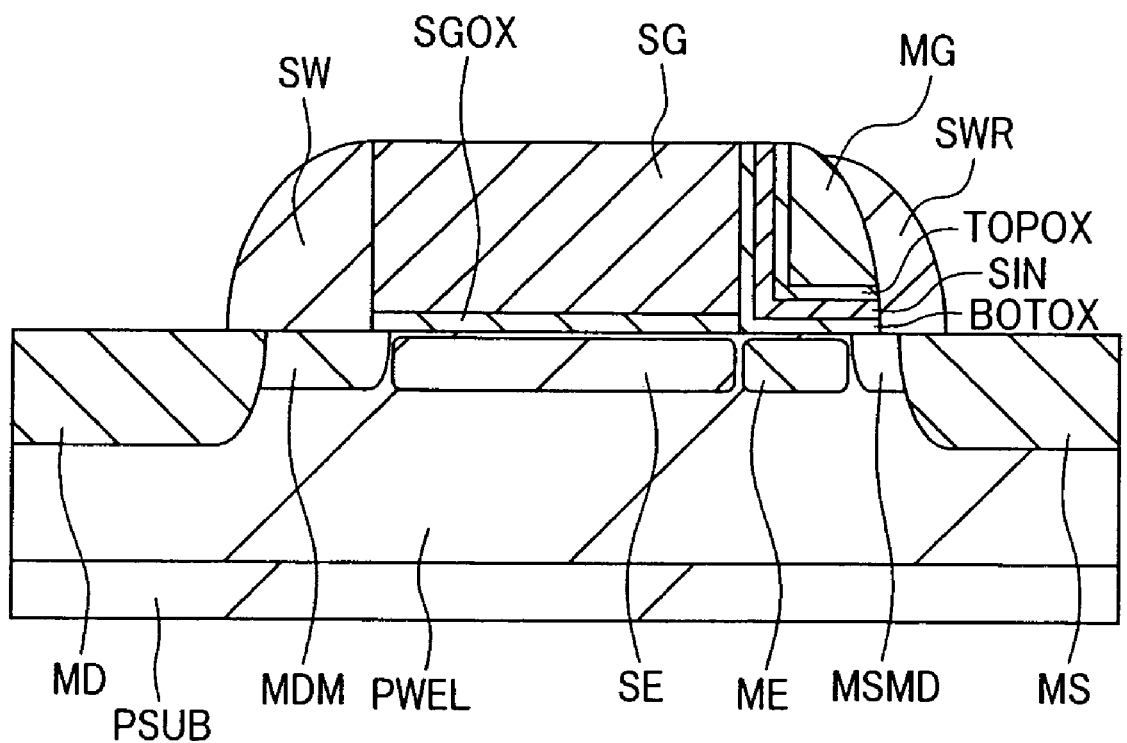
FIG. 27 is a sectional view showing a principal portion of another nonvolatile semiconductor memory device (flash memory) according to an embodiment of the present invention.

FIG. 27 shows a memory cell in which a source diffusion layer region has an LDD structure. In the case of making a memory cell minute and shortening a memory gate length, if the source diffusion layer region has a DDD structure, a leakage current of the memory transistor increases by a short channel effect. Therefore, it is desirable that the source diffusion layer region has an LDD structure.

Figure 23:
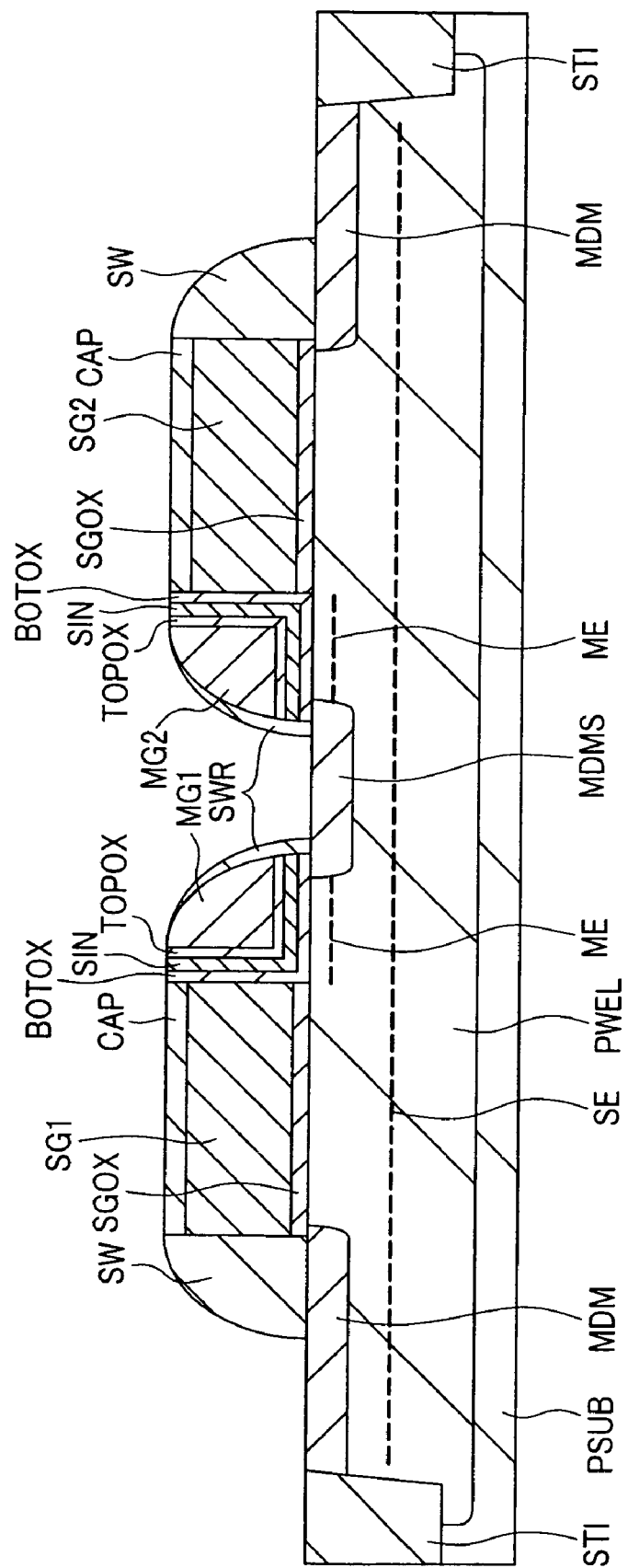
FIG. 23 is a sectional view showing a principal portion of a substrate in a method of manufacturing a nonvolatile semiconductor memory device according to an embodiment of the present invention.

In the case of this memory cell, in the source diffusion layer region of the LDD structure, a shallow low concentration n-type doped region MSMD is formed together with a shallow low concentration n-type doped region MDM of the drain section, and a deep high concentration n-type doped region MS is formed together with the high concentration n-type doped region MD of the drain section without removing the silicon oxides SWR formed on the respective sidewalls of the memory gate electrodes MG1 and MG2 shown in FIG. 23. At this time, the low concentration n-type doped region MSM of the source section shown in FIG. 24 is not formed. However, it is not always required that the shallow low concentration n-type doped regions MDM in the source section and the drain section are formed simultaneously and the impurity profiles are made equal to each other. In this case, the respective doped regions are independently formed by using the photolithography technique.

Figure 28:
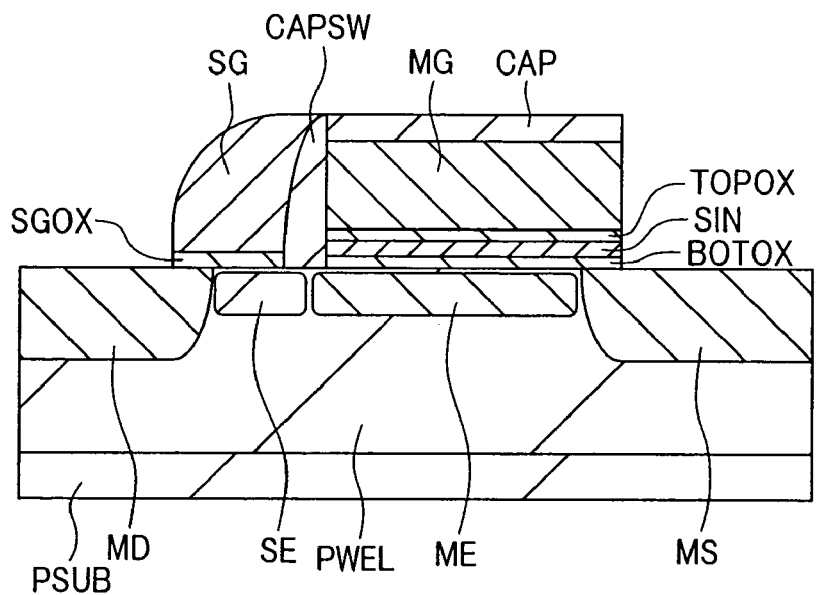
FIG. 28 is a sectional view showing a principal portion of another nonvolatile semiconductor memory device (flash memory) according to an embodiment of the present invention.

FIG. 28 shows a memory cell in which the select gate electrode SG has the same shape as that of the sidewall spacer of the memory gate electrode MG.

In such a memory cell, the ONO film (BOTOX, SIN, and TOPOX) and the memory gate electrode MG of the memory transistor are formed first, and a sidewall spacer CAPSW made of an insulator film is formed on the sidewalls of the ONO film and the memory gate electrode MG. Further on the sidewalls, similarly to the memory gate of the memory cell having been described with reference to FIG. 1 or the like, the select gate electrode SG is formed by using the anisotropic etching technique.

Note that, by forming the sidewall spacer CAPSW making of an oxide film thicker than the gate oxide film SGOX of the select transistor, a breakdown voltage between the memory gate electrode MG and the select gate electrode SG can be improved.

Further, the impurity injections into the channel region (n-type doped region ME) of the memory transistor and into the channel region SE of the select transistor are performed before and after the memory gate electrode MG, respectively.

Figure 29:
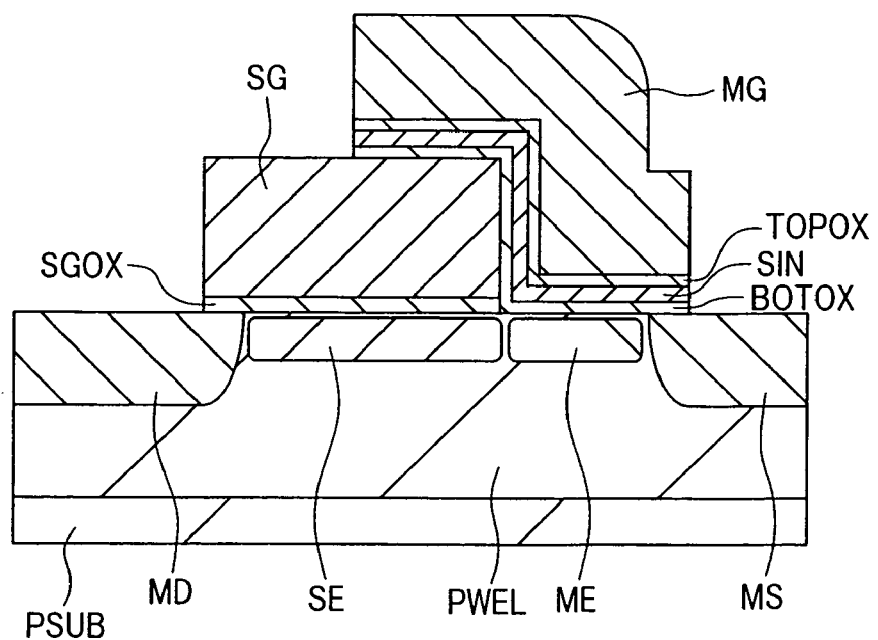
FIG. 29 is a sectional view showing a principal portion of another nonvolatile semiconductor memory device (flash memory) according to an embodiment of the present invention.

FIG. 29 is a memory cell having a structure in which the memory gate electrode MG runs on the select gate electrode SG.

In such a memory cell, similarly to the memory cell having been described with reference to FIG. 1 or the like, the select gate electrode SG is formed first, and the ONO film and the memory gate electrode MG are formed by using the photolithography technique. The impurity injections into the channel region (n-type doped region ME) of the memory transistor and into the channel region SE of the select transistor are performed similarly to the case having been described with reference to FIG. 19.

Figure 30:
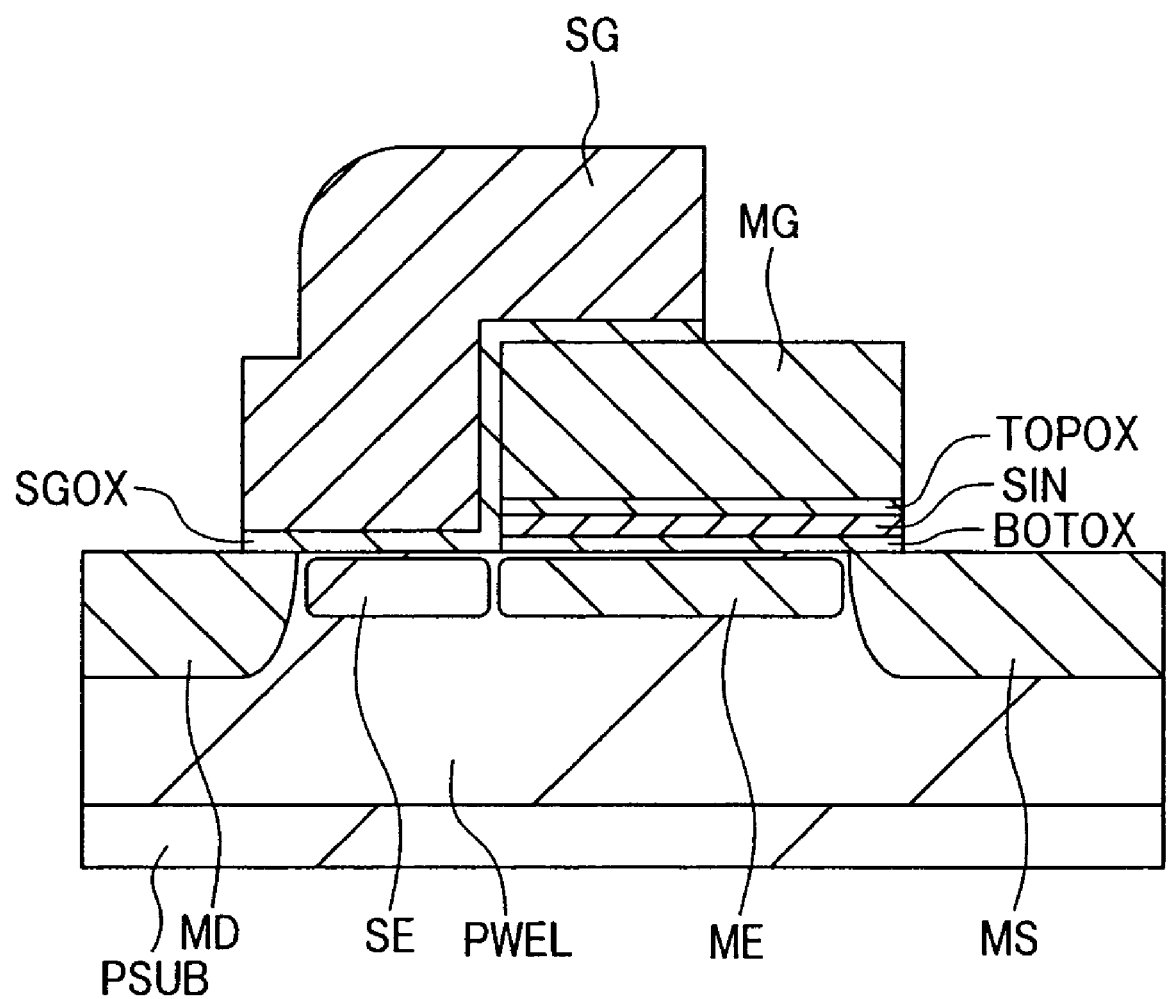
FIG. 30 is a sectional view showing a principal portion of another nonvolatile semiconductor memory device (flash memory) according to an embodiment of the present invention.

FIG. 30 is a memory cell having a structure in which the select gate electrode SG runs on the memory gate electrode MG.

The memory cell can be formed by the same manner as that of the memory cell shown in FIG. 28 except that the select gate electrode SG is formed by the photolithography technique. More specifically, after the ONO film and the memory gate electrode MG are formed first, the select gate electrode SG is formed. The impurity injections into the channel region (n-type doped region ME) of the memory transistor and into the channel region SE of the select transistor are performed before and after the memory gate electrode MG, respectively.

Thus, also in the memory cell structures shown in FIGS. 27 to 30, under the same voltage conditions as those of the memory cell arrays shown in FIGS. 6 to 15, the same operation as that of the memory cell shown in FIG. 1 can be performed.

Further, as described with reference to FIG. 16, the concrete configuration of the memory cell, which can speed up the erase and read operations and improve the reliability of the high-temperature data retention characteristics, may be applied to the memory cells shown in FIGS. 27 to 30.

As described above, in this embodiment, the silicon nitride film is used as the change accumulation film of the memory cell. However, instead of the silicon nitride film, there may be used a charge trap insulator film making of a oxynitride silicon film, a tantalum oxide film, an aluminum oxide film, or the like.

Further, fine particles (dots) made from a conductive material such as polysilicon may be used as the charge accumulation layer. The dots are obtained by, for example, depositing a plurality of polysilicon particles on the bottom oxide film. A top oxide film is formed on the dots, and the individual dots are insulated therebetween. When such dots are used, charges (electrons) accumulated in the dots do not easily move between the dots. Therefore, by fitting the position of the electron injection and that of the hole injection, the above-mentioned effect can be achieved. Further, the dots can be applied to the memory cells shown in FIGS. 1 and 27 to 30. If the dots are used, each of the dots desirably has a diameter of 10 nm or less and an insulator film is deposited between the dots to discretely accumulate charges.

Note that, in the case of using a single floating gate electrode with a conductivity, since electrons and holes can move in the floating gate, the effect obtained by fitting the position of the electron injection and that of the hole injection is small.

As mentioned above, the inventions made by the present inventors have been described based on the embodiments. However, needless to say, the present invention is not limited to the embodiments and can be variously altered and modified without departing from the gist thereof.

Effects obtained by representative ones among the inventions disclosed by the present application will be briefly described as follows.

The nonvolatile semiconductor memory device can be achieved with high reliability. Particularly, improvement of the data retention characteristics and of speed-up of the read operation can be achieved. Further, speed-up of the erase operation and improvement of the write/erase endurance characteristics or improvement of the write disturb characteristics can be achieved.

Furthermore, the number of erase cells in the nonvolatile memory array can be arbitrarily set.

What is claimed is:

1. A semiconductor device comprising:
   first and second semiconductor regions formed in a semiconductor substrate;
   a first insulator film formed on the semiconductor substrate and including a charge accumulation portion,
   wherein holes are generated in a third semiconductor region between the first and second semiconductor regions by flowing a current between the first semiconductor region and the second semiconductor region and then the holes generated in the third region are injected into the charge accumulation portion.

2. A semiconductor device according to claim 1, further comprising:
   a second insulator film formed on the third semiconductor region;
   a first conductor formed on the first insulator film; and
   a second conductor formed on the second insulator film,
   wherein the first semiconductor region and the second conductor are supplied a different voltage to generate a channel in the third semiconductor region.

3. A semiconductor device according to claim 2, wherein a portion of the first insulator film is between the first conductor and the second conductor.

4. A semiconductor device according to claim 2, wherein when the holes are injected into the charge accumulation portion, the first conductor is supplied a negative voltage.

5. A semiconductor device according to claim 2, wherein the holes are generated under a gap of the first and second conductors.

6. A semiconductor device according to claim 1, wherein the charge accumulation portion is a trap insulator film formed in the first insulator film.

7. A semiconductor device according to claim 1, wherein the charge accumulation portion is a nitride film formed in the first insulator film.

8. A semiconductor device according to claim 1, wherein the first insulator film is a laminated film of a first oxide film, a nitride film, and a second oxide film.

* * * * *